US011127632B1

(12) United States Patent
Shih

(10) Patent No.: US 11,127,632 B1
(45) Date of Patent: Sep. 21, 2021

(54) SEMICONDUCTOR DEVICE WITH CONDUCTIVE PROTRUSIONS AND METHOD FOR FABRICATING THE SAME

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/823,759

(22) Filed: Mar. 19, 2020

(51) Int. Cl.
*H01L 21/768* (2006.01)
*H01L 23/58* (2006.01)
*H01L 23/532* (2006.01)
*H01L 23/522* (2006.01)
*H01L 21/02* (2006.01)
*H01L 21/311* (2006.01)
*H01L 23/00* (2006.01)

(52) U.S. Cl.
CPC .. *H01L 21/76898* (2013.01); *H01L 21/02126* (2013.01); *H01L 21/02203* (2013.01); *H01L 21/31133* (2013.01); *H01L 21/76829* (2013.01); *H01L 21/76841* (2013.01); *H01L 23/5226* (2013.01); *H01L 23/5329* (2013.01); *H01L 23/585* (2013.01); *H01L 24/04* (2013.01); *H01L 2224/0401* (2013.01)

(58) Field of Classification Search
CPC ........... H01L 21/76898; H01L 23/5329; H01L 21/76829; H01L 23/585; H01L 21/76841; H01L 21/02126; H01L 21/31133; H01L 23/5226; H01L 21/02203; H01L 24/04; H01L 2224/0401
See application file for complete search history.

(56) References Cited

U.S. PATENT DOCUMENTS

| 2014/0117564 | A1* | 5/2014 | Yu ..................... H01L 23/49822 257/774 |
| 2017/0154878 | A1* | 6/2017 | Kim ....................... H01L 25/50 |
| 2017/0162550 | A1* | 6/2017 | Das ..................... H01L 23/5329 |
| 2020/0350218 | A1* | 11/2020 | Kuo ......................... H01L 24/17 |

* cited by examiner

*Primary Examiner* — Karen Kusumakar
(74) *Attorney, Agent, or Firm* — Muncy, Geissler, Olds & Lowe, P.C.

(57) ABSTRACT

The present application discloses a semiconductor device and a method for fabricating the semiconductor device. The semiconductor device includes a first semiconductor structure, a first connecting structure positioned on the first semiconductor structure, and a second semiconductor structure positioned on the first connecting structure. The first connecting structure includes a first connecting insulating layer positioned on the first semiconductor structure, a plurality of first connecting contacts positioned in the first connecting insulating layer, and a plurality of first supporting contacts positioned in the first connecting insulating layer. The top surfaces of the plurality of first connecting contacts contact a bottom surface of the second semiconductor structure. A top surface of the plurality of first connecting contact and a top surface of the plurality of first supporting contact protrude from a top surface of the first connecting insulating layer.

18 Claims, 23 Drawing Sheets

SEMICONDUCTOR DEVICE WITH CONDUCTIVE PROTRUSIONS AND METHOD FOR FABRICATING THE SAME

TECHNICAL FIELD

The present disclosure relates to a semiconductor device and a method for fabricating the semiconductor device, and more particularly, to a semiconductor device with conductive protrusions and a method for fabricating the semiconductor device with the connecting structure.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the down-scaling process, and such issues are continuously increasing in quantity and complexity. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device, comprising: a first semiconductor structure; a first connecting structure comprising a first connecting insulating layer positioned on the first semiconductor structure, a plurality of first connecting contacts positioned in the first connecting insulating layer, and a plurality of first supporting contacts positioned in the first connecting insulating layer; and a second semiconductor structure positioned on the first connecting structure, wherein the top surfaces of the plurality of first connecting contacts contact a bottom surface of the second semiconductor structure; wherein a top surface of the plurality of first connecting contact and a top surface of the plurality of first supporting contact protrude from a top surface of the first connecting insulating layer.

In some embodiments, the plurality of first connecting contacts have a thickness greater than a thickness of the plurality of first supporting contacts.

In some embodiments, the first semiconductor structure comprises a first substrate positioned below the first connecting structure and a first interconnection structure positioned between the first substrate and the first connecting structure, wherein the first connecting insulating layer is positioned on the first interconnection structure.

In some embodiments, the first interconnection structure comprises a first insulating layer positioned on the first substrate and a plurality of first conductive features positioned in the first insulating layer, wherein the bottom surfaces of the first connecting contacts contact top surfaces of the plurality of first conductive features coplanar with a top surface of the first insulating layer.

In some embodiments, the second semiconductor structure comprises a second interconnection structure positioned on the first connecting structure and a second substrate positioned on the second interconnection structure, wherein the second interconnection structure comprises a second insulating layer positioned on the first connecting structure and a plurality of second conductive features positioned in the second insulating layer, wherein the top surfaces of the plurality of first connecting contacts contact bottom surfaces of the plurality of second conductive features coplanar with a bottom surface of the second insulating layer.

In some embodiments, the second interconnection structure comprises a plurality of guard rings positioned in the second insulating layer, wherein bottom surfaces of the plurality of guard rings contact the top surfaces of the plurality of first supporting contacts.

In some embodiments, the semiconductor device further comprises a plurality of first liners positioned on sidewalls of the plurality of first connecting contacts and the bottom surfaces of the plurality of first connecting contacts.

In some embodiments, the semiconductor device further comprises a first porous layer positioned between the first connecting insulating layer and the second insulating layer, between the first connecting insulating layer and the plurality of first connecting contacts, and between the first connecting insulating layer and the plurality of first supporting contacts, wherein a porosity of the first porous layer is between about 25% and about 100%.

In some embodiments, the semiconductor device further comprises a plurality of first liners positioned between the first porous layer and the plurality of first connecting contacts and between the first porous layer and the first supporting contacts.

In some embodiments, the semiconductor device further comprises a through substrate via positioned in the second substrate.

In some embodiments, the first connecting insulating layer comprises a first bottom insulating layer positioned on the top surface of the first semiconductor structure, a first middle insulating layer positioned on the first bottom insulating layer, and a first top insulating layer positioned on the first middle insulating layer, wherein the plurality of first connecting contacts penetrate the first bottom insulating layer, the first middle insulating layer, and the first top insulating layer, and the plurality of first supporting contacts are positioned in the first top insulating layer.

In some embodiments, the semiconductor device further comprises a second connecting structure positioned on the first connecting structure, and a second semiconductor structure positioned on the second connecting structure, wherein the second connecting structure comprises a second connecting insulating layer positioned on the first connecting structure, a plurality of second connecting contacts positioned in the second connecting insulating layer, and a plurality of second supporting contacts positioned in the second connecting insulating layer, wherein bottom surfaces of the plurality of second connecting contacts contact the top surfaces of the plurality of first connecting contacts.

In some embodiments, a cross-sectional profile of sidewalls of the plurality of first connecting contacts is slanted.

Another aspect of the present disclosure provides a method for fabricating a semiconductor device, comprising: providing a first semiconductor structure; forming a first connecting structure comprising a first connecting insulating layer on the first semiconductor structure, a plurality of first connecting contacts in the first connecting insulating layer, and a plurality of first supporting contacts in the first connecting insulating layer, wherein a top surface of the plurality of first connecting contact and a top surface of the plurality of first supporting contact protrude from a top surface of the first connecting insulating layer; and bonding a second semiconductor structure to the first connecting structure, wherein the top surfaces of the plurality of first connecting contacts contact a bottom surface of the second semiconductor structure;

In some embodiments, the first connecting insulating layer comprises a first bottom insulating layer formed on the first semiconductor structure, a first middle insulating layer formed on the first bottom insulating layer, and a first top insulating layer formed on the first middle insulating layer, wherein the plurality of first connecting contacts are formed so as to penetrate the first top insulating layer, the first middle insulating layer, and the first bottom insulating layer and the plurality of first supporting contacts are formed in the first top insulating layer.

In some embodiments, the method for fabricating the semiconductor device further comprises: forming a layer of an energy-removable material on a top surface of the first connecting insulating layer, between the plurality of first connecting contacts and the first connecting insulating layer, and between the plurality of first supporting contacts and the first connecting insulating layer; and performing an energy treatment to turn the layer of energy-removable material into a first porous layer, wherein a porosity of the first porous layer is between about 25% and about 100%.

In some embodiments, the energy-removable material comprises a base material and a decomposable porogen material.

In some embodiments, the base material comprises methylsilsesquioxane, low-dielectric materials, or silicon oxide.

In some embodiments, an energy source of the energy treatment is heat, light, or a combination thereof.

In some embodiments, the method for fabricating the semiconductor device further comprises: thinning the first porous layer on the top surface of the first top insulating layer such that the top surface of the plurality of first connecting contact and the top surface of the plurality of first supporting contact protrude from the top surface of the first connecting insulating layer.

Due to the design of the semiconductor device of the present disclosure, multiple semiconductor devices may be connected together through the first connecting structure to provide more sophisticated functionality while occupying less volume. Therefore, the cost of the semiconductor device may be reduced, and the profit of the semiconductor device may be increased. In addition, the plurality of first supporting contacts may improve the bonding strength between the first connecting structure and the multiple semiconductor structures.

In addition, the plurality of protrusions may prevent the metal-to-metal bonding from dielectrically interfering with the first top insulating layer or the second insulating layer. Therefore, a more reliable bonding between the second semiconductor structure and the first connecting structure may be achieved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
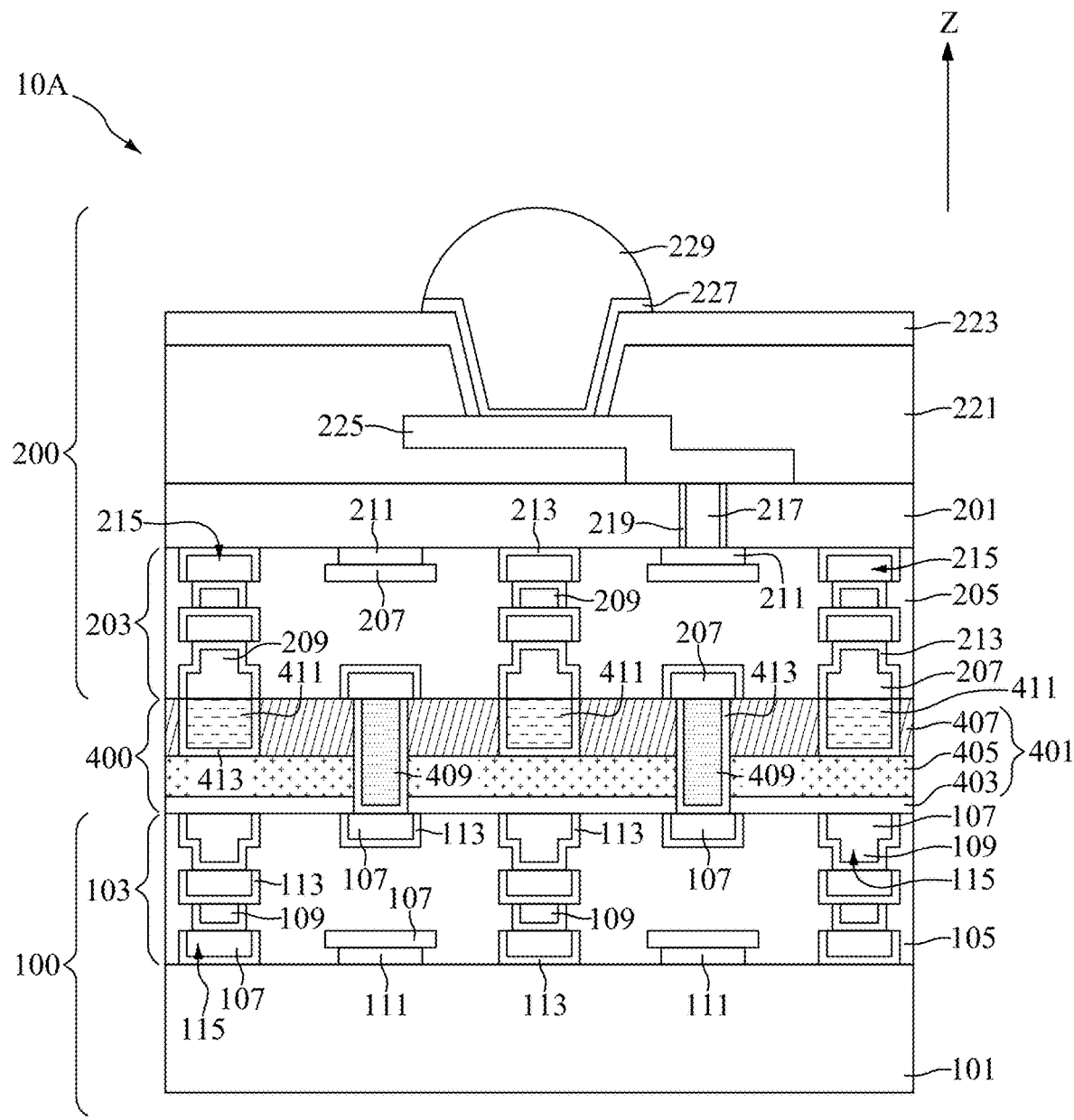
FIG. 1 illustrates, in a schematic cross-sectional diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

FIG. 1 illustrates, in a schematic cross-sectional diagram, a semiconductor device 10A in accordance with one embodiment of the present disclosure.

With reference to FIG. 1, the semiconductor device 10A may include a first semiconductor structure 100, a second semiconductor structure 200, and a first connecting structure 400. The first semiconductor structure 100 and the second semiconductor structure 200 may be a semiconductor wafer, a portion of a semiconductor wafer, or a semiconductor die. In the embodiment depicted, the first semiconductor structure 100 and the second semiconductor structure 200 are semiconductor dies. The first semiconductor structure 100 may include a first substrate 101 and a first interconnection structure 103. The first interconnection structure 103 may be disposed on the first substrate 101.

With reference to FIG. 1, the first substrate 101 may be formed of, for example, silicon, silicon carbide, germanium silicon germanium, gallium arsenic, indium arsenide, indium, or other semiconductor materials including group III, group IV, and group V elements. In some embodiments, the first substrate 101 may include a silicon-on-insulator structure. For example, the first substrate 101 may include a buried oxide layer formed by using a process such as separation by implanted oxygen.

With reference to FIG. 1, the first interconnection structure 103 may include a first insulating layer 105, a plurality of device elements (not shown in FIG. 1 for clarity), and a plurality of first conductive features. The first insulating layer 105 may be disposed on the first substrate 101. In some embodiments, the first insulating layer 105 may be a stacked layer structure. The first insulating layer 105 may include a plurality of first insulating sub-layers. Each of the plurality of first insulating sub-layers may have a thickness between about 0.5 micrometer and about 3.0 micrometer. The plurality of first insulating sub-layers may be formed of, for example, silicon oxide, borophosphosilicate glass, undoped silicate glass, fluorinated silicate glass, low-k dielectric materials, the like, or a combination thereof. The plurality of first insulating sub-layers may be formed of different materials, but are not limited thereto. The low-k dielectric materials may have a dielectric constant less than 3.0 or even less than 2.5. In some embodiments, the low-k dielectric materials may have a dielectric constant less than 2.0.

In some embodiments, the plurality of device elements may be disposed in a lower portion of the first insulating layer 105. The plurality of device elements may be disposed on the first substrate 101. The plurality of device elements may be, for example, bipolar junction transistors, metal-oxide-semiconductor field-effect transistors, diodes, system large-scale integration, flash memories, dynamic random-access memories, static random-access memories, electrically erasable programmable read-only memories, image sensors, micro-electro-mechanical systems, active devices, or passive devices. In some embodiments, portions of the device elements may be disposed in the first substrate 101. For example, source/drain regions of a metal-oxide-semiconductor field-effect transistor may be disposed in the first substrate 101. In some embodiments, the device elements may be electrically insulated from neighboring device elements by insulating structures such as shallow trench isolations.

It should be noted that, in the description of the present disclosure, a surface of an element (or a feature) located at the highest vertical level along the direction Z is referred to as a top surface of the element (or the feature). A surface of an element (or a feature) located at the lowest vertical level along the direction Z is referred to as a bottom surface of the element (or the feature).

With reference to FIG. 1, the plurality of first conductive features may be disposed in the first insulating layer 105. The plurality of first conductive features may include, for example, a plurality of first conductive lines 107, a plurality of first conductive vias 109, and a plurality of first conductive contacts 111. The first conductive vias 109 may connect adjacent conductive lines along the direction Z. The first conductive vias 109 may improve heat dissipation in the first interconnection structure 103 and provide structural support to the first interconnection structure 103. In some embodiments, the plurality of device elements may be interconnected through the plurality of first conductive features. In some embodiments, some of the plurality of first conductive features may include wider portions. The wider portions may be referred to as first conductive pads. In some embodiments, a plurality of first barrier layers 113 may be disposed between the plurality of first conductive features and the first insulating layer 105. Each of the plurality of first barrier layers 113 may cover sidewalls and a bottom surface of a corresponding one of the plurality of first conductive features. Some of the plurality of first barrier layers 113 may be disposed between some of the plurality of first conductive features. For example, one of the plurality of first barrier layers 113 may be disposed between a first conductive line 107 and a first conductive via 109 that are adjacent to each other.

With reference to FIG. 1, the first interconnection structure 103 may include a plurality of first guard rings 115. The plurality of first guard rings 115 may consist of some of the plurality of first conductive lines 107 and some of the plurality of first conductive vias 109 electrically connected. The plurality of first guard rings 115 may be dummies. The plurality of first guard rings 115 may have a same thickness as a thickness of the first insulating layer 105. In other words, the plurality of first guard rings 115 may penetrate the first insulating layer 105 along the direction Z. The plurality of first guard rings 115 may facilitate the planarization process during the formation of the plurality of first conductive features. The plurality of first guard rings 115 may also facilitate a bonding process with another structure such as the first connecting structure 400 or the second semiconductor structure 200. Furthermore, the plurality of first guard rings 115 may improve the mechanical strength of the first interconnection structure 103. In some embodiments, the first guard ring 115 may consist of some conductive lines 107 disposed along the direction Z and apart from each other.

It should be noted that referring to an element as a "dummy" element means the element is electrically insulated from all of the device elements. In addition, when the semiconductor device is in operation, no exterior voltage or current will apply to the element.

With reference to FIG. 1, the top surface of the first insulating layer 105 and the top surfaces of some of the plurality of first conductive lines 107 may be substantially coplanar. In some embodiments, the top surface of the first insulating layer 105, the top surfaces of some of the plurality of first conductive lines 107, and the top surfaces of some of the plurality of first guard rings 115 may be substantially coplanar. In some embodiments, the top surface of the first insulating layer 105, the top surfaces of some of the plurality of first conductive lines 107, the top surfaces of some of the plurality of first guard rings 115, and the top surfaces of some of the plurality of first barrier layers 113 may be substantially coplanar. The plane consisting of the top surface of the first insulating layer 105, the top surfaces of some of the plurality of first conductive lines 107, the top surfaces of some of the plurality of first guard rings 115, and the top surfaces of some of the plurality of first barrier layers 113 may be referred to as the top surface of the first interconnection structure 103.

In some embodiments, the bottom surfaces of some of the plurality of first conductive contacts 111 and the bottom surface of the first insulating layer 105 may be substantially coplanar. In some embodiments, the bottom surfaces of some of the plurality of first conductive contacts 111, the bottom surfaces of some other of the plurality of first guard rings 115, the bottom surface of the first insulating layer 105, and the top surface of the first substrate 101 may be substantially coplanar. The plane consisting of the bottom surfaces of some of the plurality of first conductive contacts 111, the bottom surfaces of some other of the plurality of first guard rings 115, and the bottom surface of the first insulating layer 105 may be referred to as the bottom surface of the first interconnection structure 103.

The plurality of first conductive lines 107, the plurality of first conductive vias 109, and the plurality of first conductive contacts 111 may be formed of, for example, copper, aluminum, titanium, the like, or a combination thereof. The plurality of first conductive lines 107, the plurality of first conductive vias 109, and the plurality of first conductive contacts 111 may be formed of different materials, but are not limited thereto. The plurality of first barrier layers 113 may be formed of, for example, titanium nitride, tantalum nitride, titanium, tantalum, titanium tungsten, the like, or a combination thereof.

With reference to FIG. 1, the second semiconductor structure 200 may be disposed opposite to the first semiconductor structure 100 with the first connecting structure 400 interposed therebetween. The first semiconductor structure 100 and the second semiconductor structure 200 may provide different functionalities. For example, the first semiconductor structure 100 may provide a logic function and the second semiconductor structure 200 may provide a memory function. In some embodiments, the first semiconductor structure 100 and the second semiconductor structure 200 may provide the same functionality.

With reference to FIG. 1, the second semiconductor structure 200 may include a second substrate 201, a second interconnection structure 203, a second through substrate via 217, second insulating sidewalls 219, a second top passivation layer 223, a second redistribution layer 225, a second under bump metallization layer 227, and a second conductive bump 229.

With reference to FIG. 1, the second substrate 201 may be disposed opposite to the first connecting structure 400 with the second interconnection structure 203 interposed therebetween. The second substrate 201 has a structure similar to that of the first substrate 101, but is not limited thereto. The second substrate 201 may be formed of a same material as the first substrate 101, but is not limited thereto. The second interconnection structure 203 may have a structure similar to that of the first interconnection structure 103, but is not limited thereto. In the present embodiment, the second interconnection structure 203 may have a structure similar to that of the first interconnection structure 103 but may be placed in an upside-down manner. The second interconnection structure 203 may include a second insulating layer 205, a plurality of device elements (not shown in FIG. 1 for clarity), a plurality of second conductive features, a plurality of second barrier layers 213, and a plurality of second guard rings 215. The plurality of device elements of the second semiconductor structure 200 may be disposed adjacent to an upper portion of the second insulating layer 205.

With reference to FIG. 1, the plurality of second conductive features may be disposed in the second insulating layer 205. The plurality of second conductive features may include a plurality of second conductive lines 207, a plurality of second conductive vias 209, and a plurality of second conductive contacts 211. The plurality of second guard rings 215 may consist of some of the plurality of second conductive lines 207 electrically connected to some of the plurality of second conductive vias 209. The plurality of second guard rings 215 may be dummies.

With reference to FIG. 1, the bottom surfaces of some of the plurality of second conductive lines 207, the bottom surface of the second insulating layer 205, the bottom surfaces of some of the second guard rings 215, and the bottom surfaces of some of the plurality of second barrier layers 213 may be substantially coplanar. The plane consisting of the bottom surfaces of some of the plurality of second conductive lines 207, the bottom surface of the second insulating layer 205, the bottom surfaces of some of the second guard rings 215, and the bottom surfaces of some of the plurality of second barrier layers 213 may be referred to as the bottom surface of the second interconnection structure 203. The top surfaces of some of the plurality of second conductive contacts 211, the top surfaces of some of the second guard rings 215, and the top surface of the second insulating layer 205 may be substantially coplanar. The plane consisting of the top surfaces of some of the plurality of second conductive contacts 211, the top surfaces of some of the second guard rings 215, and the top surface of the second insulating layer 205 may be referred to as the top surface of the second interconnection structure 203.

With reference to FIG. 1, the second through substrate via 217 may be disposed in the second substrate 201 and electrically connected to one of the plurality of second conductive contacts 211. In some embodiments, the second through substrate via 217 may be electrically connected to one of the device elements of the first semiconductor structure 100 through some of the plurality of second conductive features. In some embodiments, the second through substrate via 217 may be electrically connected to the first connecting structure 400 through some of the plurality of second conductive features. In some embodiments, the second through substrate via 217 may not penetrate through the second insulating layer 205. In some embodiments, the second through substrate via 217 may not occupy excessive space of the second semiconductor structure 200. Therefore, more device elements may be disposed in the second semiconductor structure 200 to provide a more sophisticated semiconductor device. The second through substrate via 217 may be formed of, for example, copper, aluminum, titanium, the like, or a combination thereof.

With reference to FIG. 1, the second insulating sidewalls 219 may be disposed on sidewalls of the second through substrate via 217. The second insulating sidewalls 219 may electrically isolate the second through substrate via 217 from neighboring conductive elements disposed adjacent to two sides of the second through substrate via 217. The second bottom passivation layer 221 may be disposed on the second substrate 201. The second top passivation layer 223 may be disposed on the second bottom passivation layer 221. A second redistribution layer 225 may be disposed in the second bottom passivation layer 221. A portion of the second bottom passivation layer 221 and a portion of the second top passivation layer 223 may be recessed to expose a portion of a top surface of the second redistribution layer 225. The second bottom passivation layer 221 and the second top passivation layer 223 may be formed of, for example, silicon nitride, silicon oxynitride, silicon oxide nitride, polyimide, polybenzoxazole, or a combination thereof. The second bottom passivation layer 221 and the second top passivation layer 223 may be formed of different materials, but are not limited thereto. The second redistribution layer 225 may be electrically connected to the second through substrate via 217. The second redistribution layer 225 may be formed of, for example, tungsten, titanium, tin, nickel, copper, gold, aluminum, platinum, cobalt, or a combination thereof.

It should be noted that, in the present disclosure, silicon oxynitride refers to a substance which contains silicon, nitrogen and oxygen and in which a proportion of oxygen is greater than that of nitrogen. Silicon nitride oxide refers to a substance which contains silicon, oxygen and nitrogen and in which a proportion of nitrogen is greater than that of oxygen.

With reference to FIG. 1, the second under bump metallization layer 227 may be disposed on the second top passivation layer 223 and the portion of the top surface of the second redistribution layer 225. The second conductive bump 229 may be disposed on the second under bump metallization layer 227 and electrically connected to the second redistribution layer 225. The second under bump metallization layer 227 may be formed of, for example, chromium, tungsten, titanium, copper, nickel, aluminum, palladium, gold, vanadium, or a combination thereof. The second conductive bump 229 may be a solder bump.

The second under bump metallization layer 227 may be a single layer structure or a stacked structure of multiple layers. For example, the second under bump metallization layer 227 may include a first conductive layer, a second conductive layer, and a third conductive layer stacked sequentially. The first conductive layer may serve as an adhesive layer for stably attaching the second conductive bump 229 to the second redistribution layer 225 and the second top passivation layer 223. For example, the first conductive layer may include at least one of titanium, titanium-tungsten, chromium, and aluminum. The second conductive layer may serve as a barrier layer for preventing a conductive material contained in the second conductive bump 229 from diffusing into the second redistribution layer 225 or the second top passivation layer 223. The second conductive layer may include at least one of copper, nickel, chromium-copper, and nickel-vanadium. The third conductive layer may serve as a seed layer for forming the second conductive bump 229 or as a wetting layer for improving wetting characteristics of the second conductive bump 229. The third conductive layer may include at least one of nickel, copper, and aluminum.

With reference to FIG. 1, the first connecting structure 400 may be disposed between the first semiconductor structure 100 and the second semiconductor structure 200. The first connecting structure 400 may include a first connecting insulating layer 401, a plurality of first connecting contacts 409, a plurality of first supporting contacts 411, and a plurality of first liners 413. The first connecting insulating layer 401 may be disposed on the top surface of the first interconnection structure 103.

With reference to FIG. 1, the plurality of first connecting contacts 409 and the plurality of first supporting contacts 411 may be disposed in the first connecting insulating layer 401. The plurality of first supporting contacts 411 may be dummies. The plurality of first connecting contacts 409 may have a thickness greater than a thickness of the plurality of first supporting contacts 411. Top surfaces of the plurality of first connecting contacts 409 may contact or bond to the bottom surfaces of some of the plurality of second conductive lines 207 coplanar with the bottom surface of the second interconnection structure 203. The top surfaces of the plurality of first connecting contacts 409 may have a width equal to or less than a width of the bottom surfaces of some of the plurality of second conductive lines 207 coplanar with the bottom surface of the second interconnection structure 203. Bottom surfaces of the plurality of first connecting contacts 409 may contact or bond to the top surfaces of some of the plurality of first conductive lines 107 coplanar with the top surface of the first interconnection structure 103. The bottom surfaces of the plurality of first connecting contacts 409 may have a width equal to or less than a width of the top surfaces of some of the plurality of first conductive lines 107 coplanar with the top surface of the first interconnection structure 103.

With reference to FIG. 1, top surfaces of the plurality of the first supporting contacts 411 may contact or bond to the bottom surfaces of the plurality of second guard rings 215 coplanar with the bottom surface of the second interconnection structure 203. In some embodiments, some of the top surfaces of the plurality of first supporting contacts 411 may contact or bond to the bottom surfaces of the plurality of second guard rings 215 coplanar with the bottom surface of the second interconnection structure 203. In some embodiments, the bottom surfaces of the plurality of first supporting contacts 411 may contact or bond to some of the plurality of second guard rings 215 coplanar with the bottom surface of the second interconnection structure 203.

In some embodiments, the plurality of first connecting contacts 409 may penetrate the first connecting insulating layer 401 along the direction Z and electrically connect the device elements of the first semiconductor structure 100 and the device elements of the second semiconductor structure 200 through some of the plurality of first conductive features and some of the plurality of second conductive features. In some embodiments, the first connecting insulating layer 401 may be a multi-layer structure including a first bottom insulating layer 403, a first middle insulating layer 405, and a first top insulating layer 407. The first bottom insulating layer 403 may be disposed on the top surface of the first interconnection structure 103. The first bottom insulating layer 403 may be an etch stop layer and may be formed of, for example, silicon nitride, silicon carbide, silicon oxide, low-k dielectric materials, extremely low-k dielectric materials, the like, or a combination thereof. The low-k dielectric materials may be, for example, carbon doped oxides. The extremely low-k dielectric materials may be, for example, porous carbon doped silicon oxide.

With reference to FIG. 1, the first middle insulating layer 405 may be disposed on the first bottom insulating layer 403. The first top insulating layer 407 may be disposed on the first middle insulating layer 405. The second interconnection structure 203 may be disposed on the first top insulating layer 407. The first middle insulating layer 405 and the first top insulating layer 407 may be formed of, for example, silicon oxide, silicon oxynitride, silicon nitride, borosilicate glass, borophosphosilicate glass, phosphoric silicate glass, fluorinated silicate glass, low-k dielectric materials, or a combination thereof. The first middle insulating layer 405 and the first top insulating layer 407 may be formed of different materials, but are not limited thereto. The plurality of first connecting contacts 409 and the plurality of first supporting contacts 411 may be formed of, for example, aluminum, copper, tungsten, or cobalt.

With reference to FIG. 1, the plurality of first connecting contacts 409 may penetrate the first top insulating layer 407, the first middle insulating layer 405, and the first bottom insulating layer 403 along the direction Z. The plurality of the first supporting contacts 411 may penetrate the first top insulating layer 407 along the direction Z. In some embodiments, the plurality of first supporting contacts 411 may penetrate the first top insulating layer 407 and an upper portion of the first middle insulating layer 405. The plurality of first supporting contacts 411 may facilitate a bonding process with the second semiconductor structure 200.

With reference to FIG. 1, the plurality of first liners 413 may be disposed on sidewalls of the plurality of first connecting contacts 409, bottom surfaces of the plurality of first connecting contacts 409, sidewalls of the plurality of first supporting contacts 411, and bottom surfaces of the plurality of first supporting contacts 411. The plurality of first liners 413 may be formed of, for example, titanium nitride, tantalum nitride, titanium, tantalum, titanium tungsten, the like, or a combination thereof.

With reference to FIG. 1, the top surfaces of the plurality of first connecting contacts 409, the top surfaces of the plurality of first supporting contacts 411, top surfaces of the plurality of first liners 413, and a top surface of the first top insulating layer 407 may be substantially coplanar. The plane consisting of the top surfaces of the plurality of first connecting contacts 409, the top surfaces of the plurality of first supporting contacts 411, the top surfaces of the plurality of first liners 413, and the top surface of the first top insulating layer 407 may be referred to as the top surface of the first connecting structure 400.

FIGS. 2 to 10 illustrate, in schematic cross-sectional diagrams, semiconductor devices 10B, 10C, 10D, 10E, 10F, 10G, 10H, 10I, and 10J in accordance with embodiments of the present disclosure.

Figure 2:
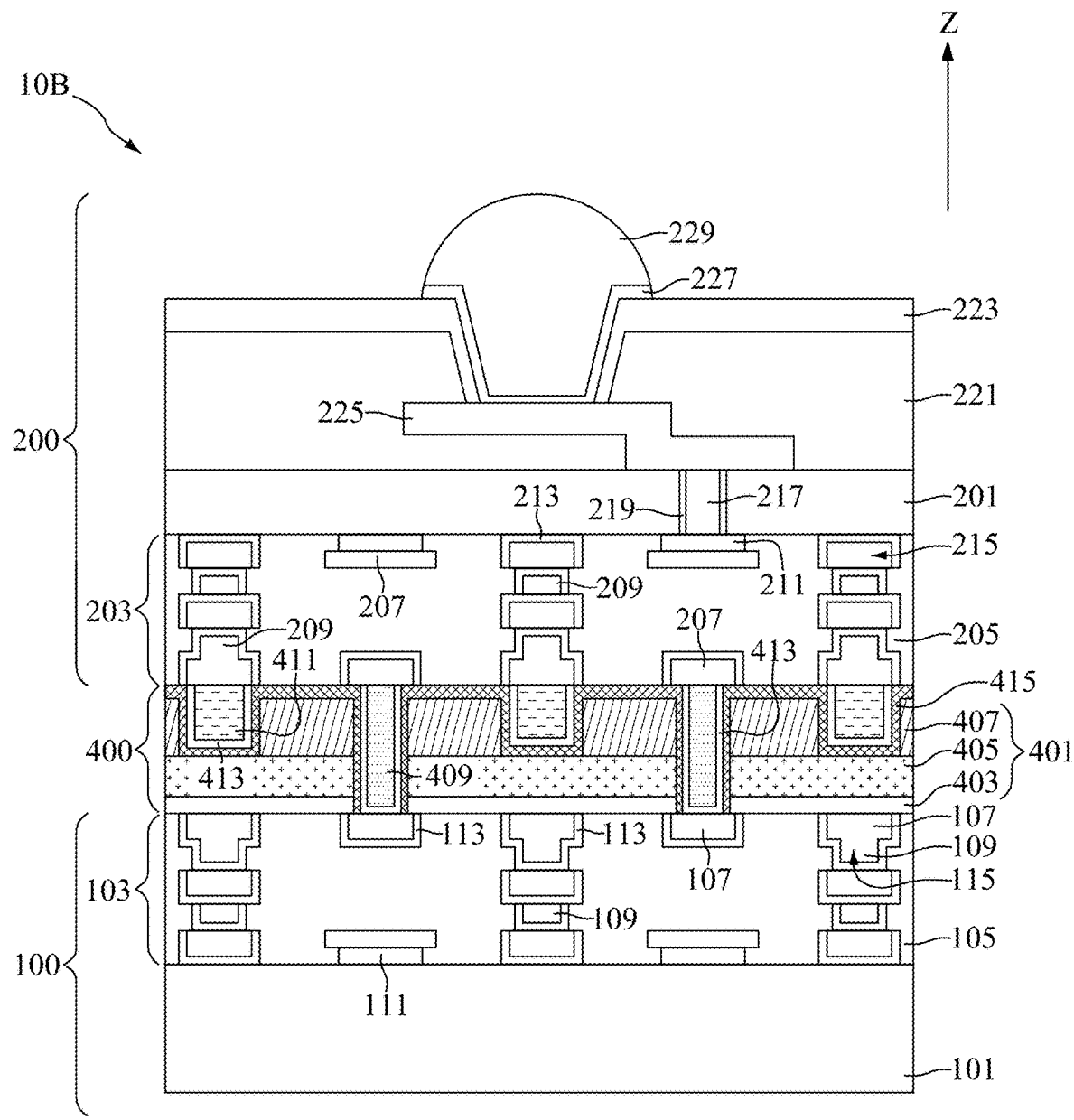
FIGS. 2 to 10 illustrate, in schematic cross-sectional diagrams, semiconductor devices in accordance with embodiments of the present disclosure.

With reference to FIG. 2, in the semiconductor device 10B, a first porous layer 415 may be disposed on a top surface of the first top insulating layer 407, the sidewalls and the bottom surfaces of the plurality of first supporting contacts 411, and the sidewalls of the plurality of first connecting contacts 409. In some embodiments, the plurality of first liners 413 may be disposed between the first porous layer 415 and the plurality of first connecting contacts 409 and between the first porous layer 415 and the plurality of first supporting contacts 411. The first porous layer 415 may be formed of an energy-removable material, as will be illustrated later.

The first porous layer 415 may include a skeleton and a plurality of empty spaces disposed throughout the skeleton. The plurality of empty spaces may connect to each other and may be filled with air. The skeleton may include, for example, silicon oxide, low-dielectric materials, or methylsilsesquioxane. The first porous layer 415 may have a porosity between 25% and 100%. It should be noted that, when the porosity is 100%, it means the first porous layer 415 includes only an empty space and the first porous layer 415 may be regarded as an air gap. In some embodiments, the porosity of the first porous layer 415 may be between 45% and 95%. The plurality of empty spaces of the first porous layer 415 may be filled with air. As a result, a dielectric constant of the first porous layer 415 may be significantly lower than a layer formed of, for example, silicon oxide. Therefore, the first porous layer 415 may significantly reduce the parasitic capacitance between the plurality of first connecting contacts 409 and the plurality of first supporting contacts 411. That is, the first porous layer 415 may significantly alleviate an interference effect between electrical signals induced or applied to the first connecting structure 400.

The energy-removable material may include a material such as a thermal decomposable material, a photonic decomposable material, an e-beam decomposable material, or a combination thereof. For example, the energy-removable material may include a base material and a decomposable porogen material that is sacrificially removed upon being exposed to an energy source.

Figure 3:
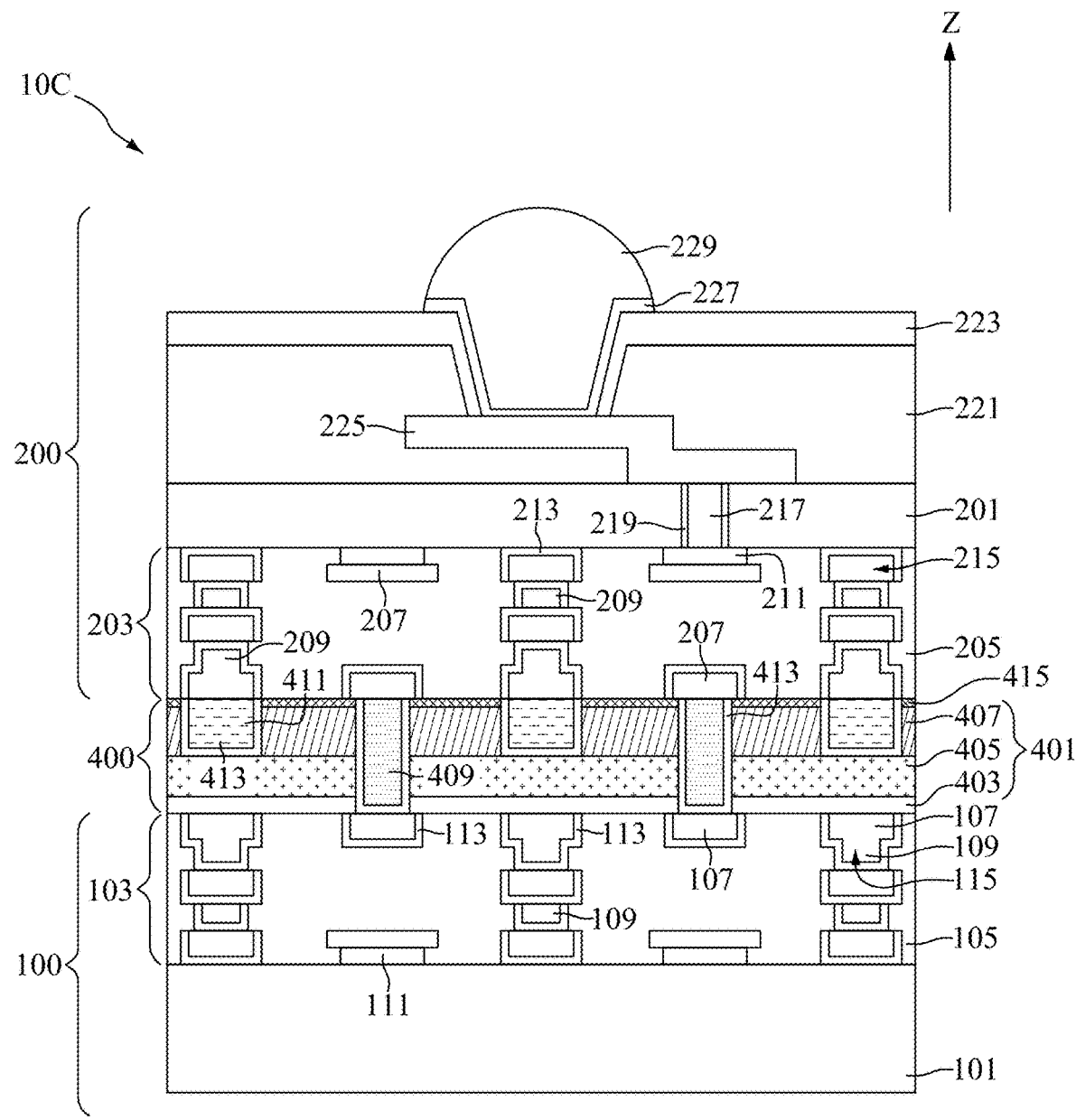

With reference to FIG. 3, in the semiconductor device 10C, the first porous layer 415 may be only disposed on the top surface of the first top insulating layer 407. The first connecting insulating layer 401 and a layer of energy-removable material may be sequentially formed on the first interconnection structure 103. Subsequently, the plurality of the first connecting contacts 409, the plurality of first supporting contacts 411, and the plurality of first liners 413 may be formed by performing single or multiple iterations of a single or double damascene process through patterning on the first porous layer 415.

Figure 4:
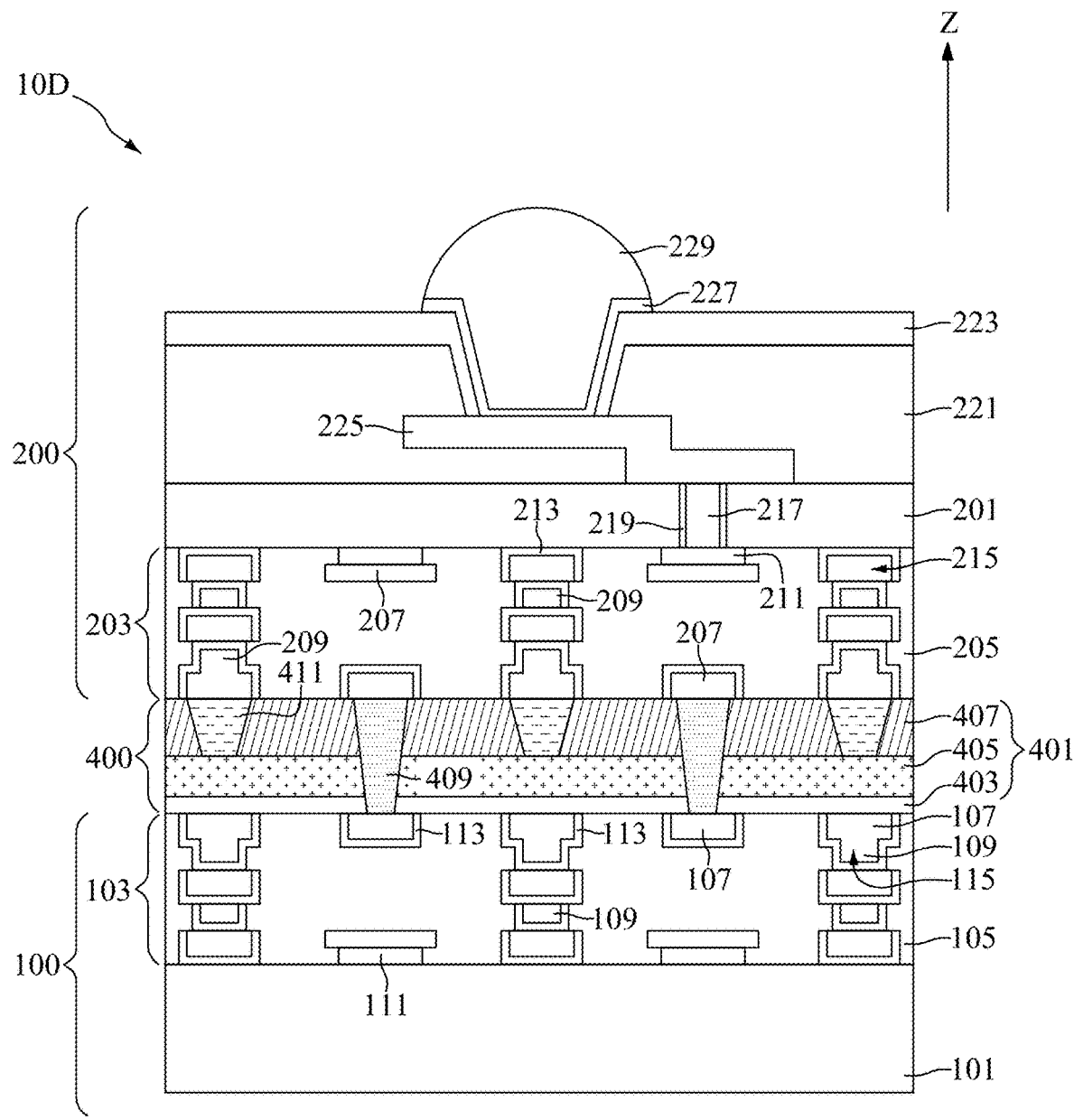

With reference to FIG. 4, in the semiconductor device 10D, the sidewalls of the plurality of first connecting contacts 409 and the sidewalls of the plurality of first supporting contacts 411 may have a slanted cross-sectional profile. In some embodiments, a width of each of the plurality of first connecting contacts 409 or a width of each of the plurality of first supporting contacts 411 may gradually become wider from bottom to top along the direction Z. In some embodiments, each of the plurality of first connecting contacts 409 as a whole or each of the plurality of first supporting contacts 411 as a whole may have a uniform slope.

Figure 5:
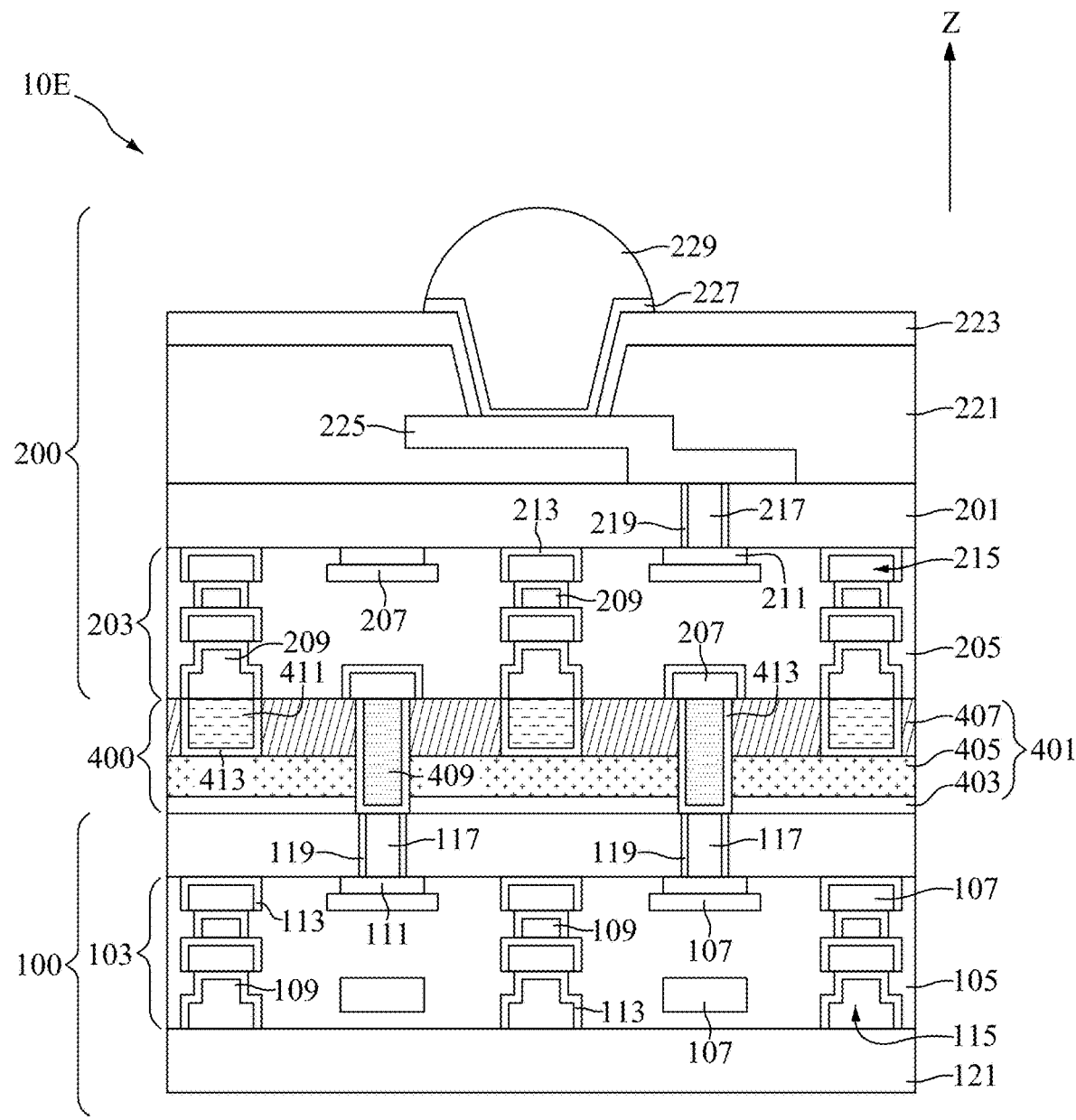

With reference to FIG. 5, in the semiconductor device 10E, the first semiconductor structure 100 may be placed in an upside-down manner. The first connecting structure 400 may be disposed on the first substrate 101. A plurality of first through substrate vias 117 may be disposed in the first substrate 101. The plurality of first through substrate vias 117 may electrically connect the plurality of the first connecting contacts 409 to some of the plurality of first conductive contacts 111. A first bottom passivation layer 121 may be disposed below the first interconnection structure 103. The first bottom passivation layer 121 may be formed of, for example, silicon nitride, silicon oxynitride, silicon oxide nitride, polyimide, polybenzoxazole, or a combination thereof. The first semiconductor structure 100 and the second semiconductor structure 200 may be stacked in a face-to-back manner.

Figure 6:
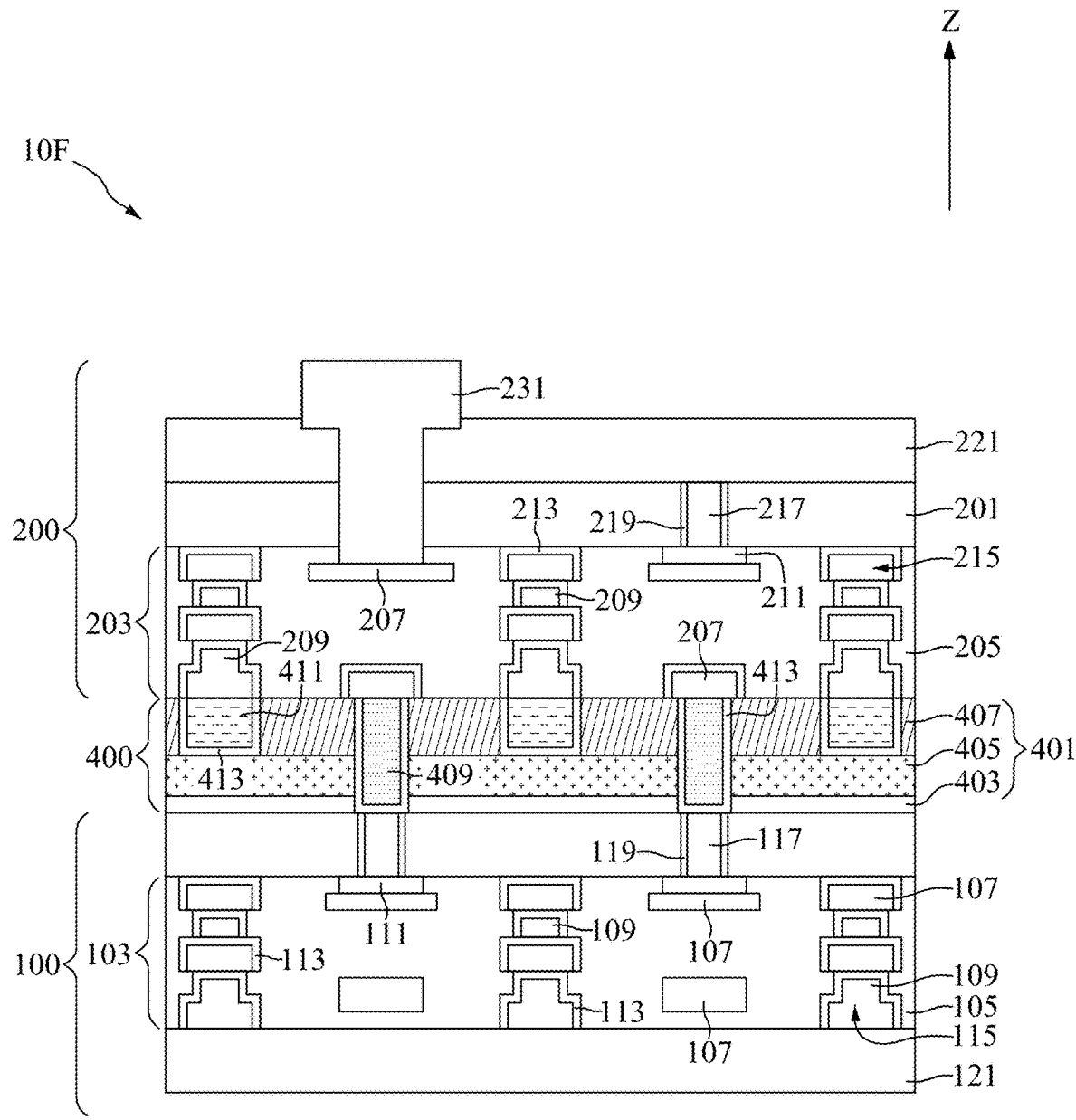

With reference to FIG. 6, in the semiconductor device 10F, a second bottom passivation layer 221 may be disposed on the second substrate 201. The second bottom passivation layer 221 may be formed of, for example, silicon nitride, silicon oxynitride, silicon oxide nitride, polyimide, polybenzoxazole, or a combination thereof. A second pad structure 231 may penetrate the second bottom passivation layer 221, the second substrate 201, and an upper portion of the second interconnection structure 203. The second pad structure 231 may electrically connect to one of the plurality of second conductive lines 207.

Figure 7:
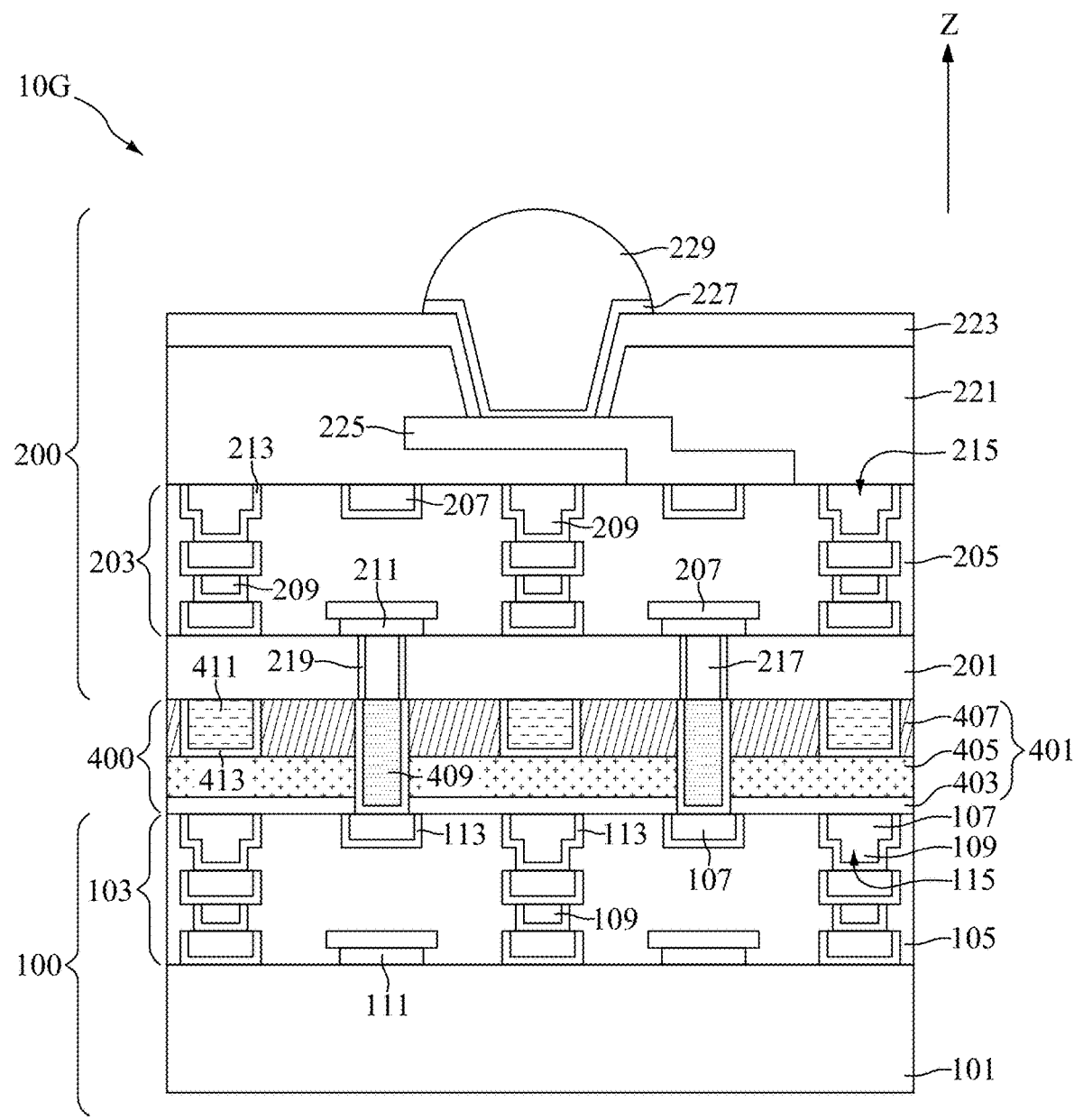

With reference to FIG. 7, in the semiconductor device 10G, the second semiconductor structure 200 may be placed in a manner similar to that of the first semiconductor structure 100. The second substrate 201 may be disposed on the first connecting structure 400. The second bottom passivation layer 221 may be disposed on the second interconnection structure 203. The second through substrate vias 217 may be disposed in the second substrate 201. The second through substrate vias 217 may electrically connect some of the plurality of second conductive contacts 211 to the plurality of the first connecting contacts 409. The first semiconductor structure 100 and the second semiconductor structure 200 may be stacked in a back-to-face manner.

Figure 8:
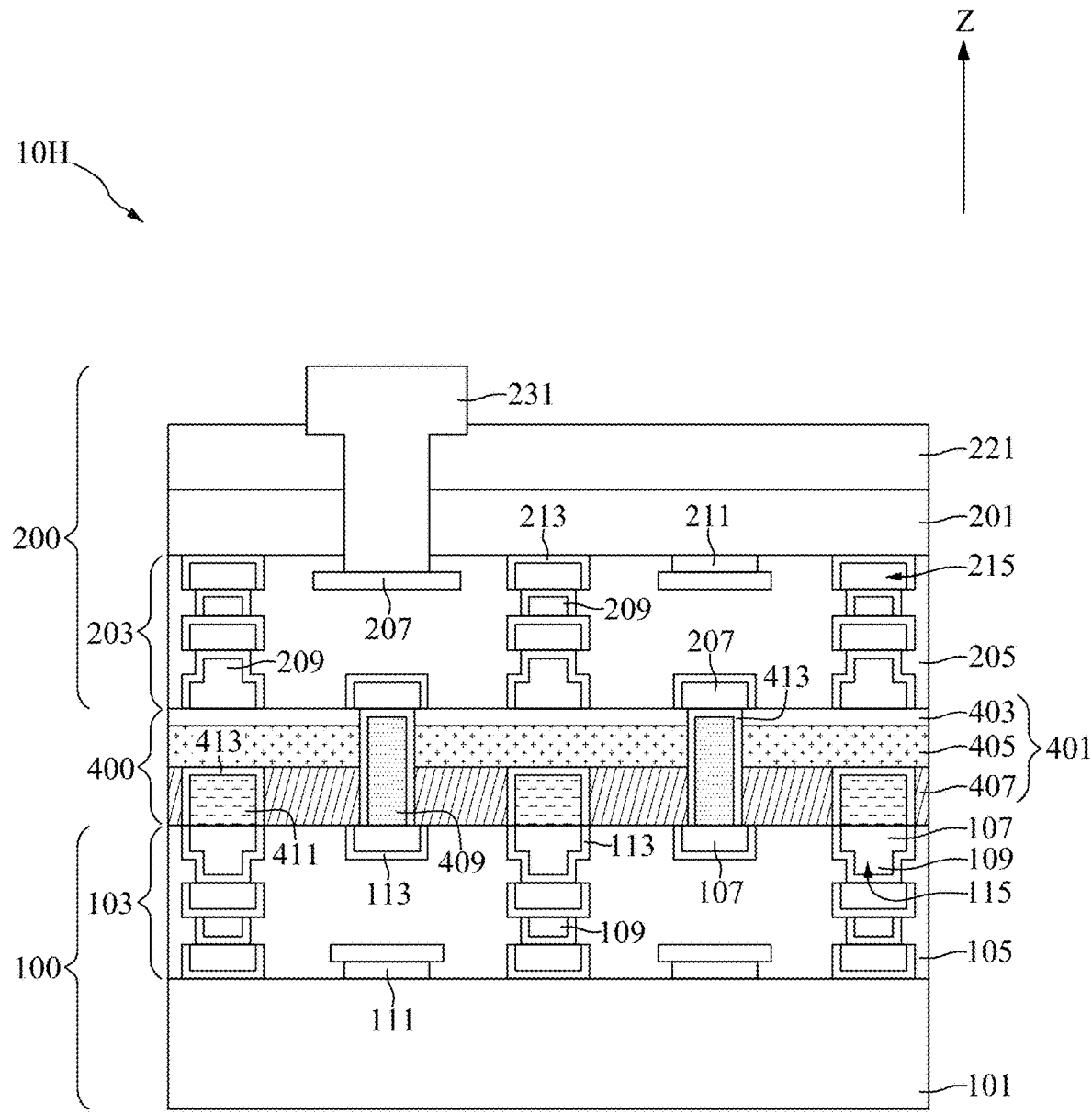

With reference to FIG. 8, in the semiconductor device 10H, the first connecting structure 400 may be placed in an upside-down manner. The first top insulating layer 407 may be disposed on the first interconnection structure 103. The second interconnection structure 203 may be disposed on the first bottom insulating layer 403. The bottom surfaces of the plurality of first supporting contacts 411 may contact or bond to the top surfaces of the first guard rings 115.

Figure 9:
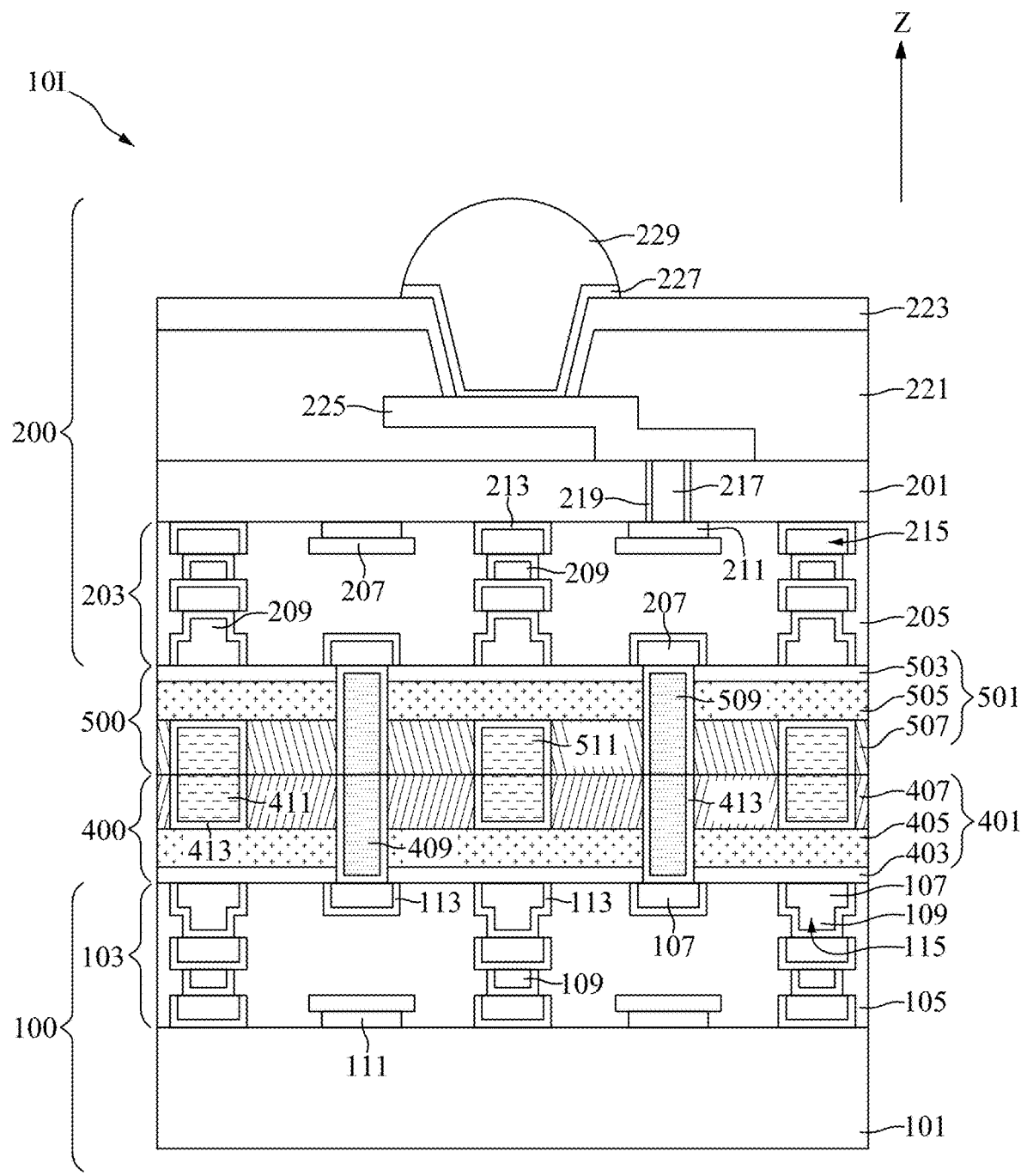

With reference to FIG. 9, in the semiconductor device 10I, a second connecting structure 500 may be disposed between the second semiconductor structure 200 and the first connecting structure 400. The second connecting structure 500 may have a structure similar with the first connecting structure 400 but is placed in an upside-down manner. The second connecting structure 500 may include a second connecting insulating layer 501, a plurality of second connecting contacts 509, a plurality of second supporting contacts 511, and a plurality of second liners 513. The second connecting insulating layer 501 may include a second bottom insulating layer 503, a second middle insulating layer 505, and a second top insulating layer 507. The second top insulating layer 507 may be disposed on the first connecting structure 400. The second middle insulating layer 505 may be disposed on the second top insulating layer 507. The second bottom insulating layer 503 may be disposed on the second middle insulating layer 505 and may be an etch stop layer.

With reference to FIG. 9, the plurality of second connecting contacts 509 may penetrate the second bottom insulating layer 503, the second middle insulating layer 505, and the second top insulating layer 507. The plurality of second connecting contacts 509 may electrically connect the some of the plurality of second conductive lines 207 to the plurality of first connecting contacts 409. The second supporting contacts 511 may be disposed in the second bottom insulating layer 503. Bottom surfaces of the plurality of second supporting contacts 511 may contact or bond to the top surfaces of the plurality of first supporting contacts 411. The plurality of second liners 513 may be disposed between the plurality of second connecting contacts 509 and the second connecting insulating layer 501, between the plurality of second supporting contacts 511 and the second connecting insulating layer 501, and between the plurality of second connecting contacts 509 and some of the plurality of second conductive lines 207.

Figure 10:
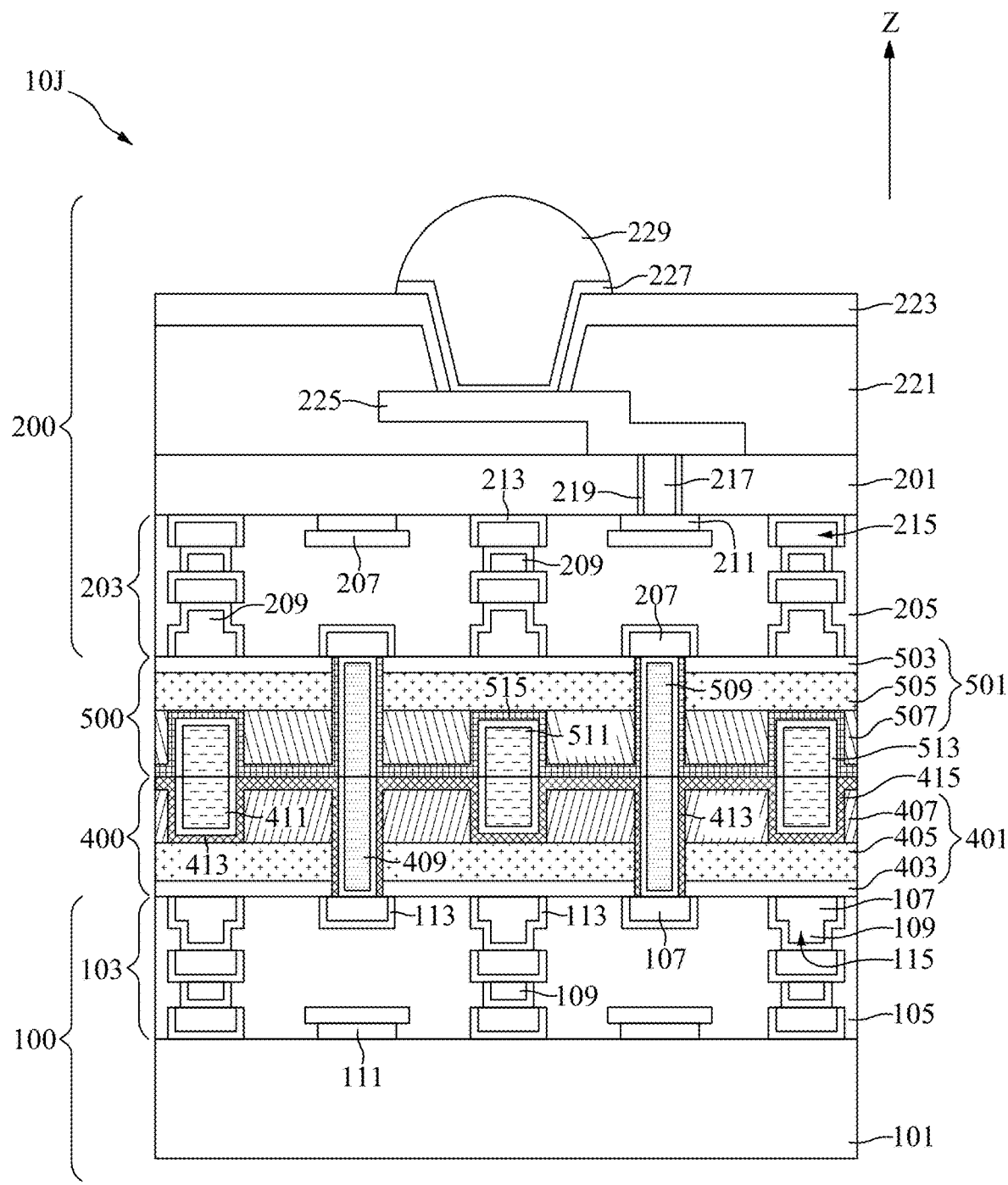

With reference to FIG. 10, in the semiconductor device 10J, a second porous layer 515 may be disposed on the bottom surface of the second top insulating layer 507, the sidewalls and bottom surfaces of the plurality of second supporting contacts 511, and the sidewalls of the plurality of second connecting contacts 509. The second porous layer 515 may be formed of a same material as the first porous layer 415. The second porous layer 515 may have a porosity between 25% and 100%. The second porous layer 515 disposed on the bottom surface of the second top insulating layer 507 and the first porous layer 415 disposed on the top surface of the first top insulating layer 407 may contact or bond to each other. In some embodiments, the first porous layer 415 may be only disposed on the top surface of the first top insulating layer 407 and the second porous layer 515 may be only disposed on the bottom surface of the second top insulating layer 507.

It should be noted that the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching and wet etching.

Figure 11:
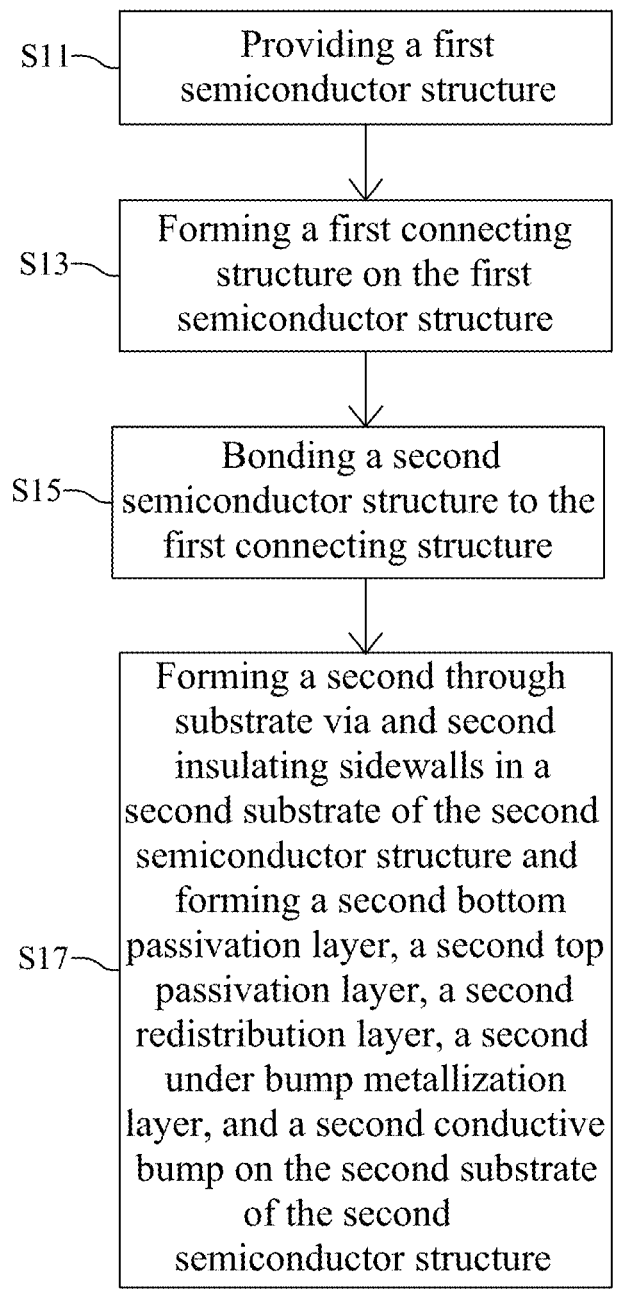
FIG. 11 illustrates, in a flowchart diagram form, a method for fabricating a semiconductor device in accordance with one embodiment of the present disclosure.

FIG. 11 illustrates, in a flowchart diagram form, a method 20 for fabricating a semiconductor device 10A in accordance with one embodiment of the present disclosure. FIGS. 13 to 16 illustrate, in schematic cross-sectional view diagrams, a flow for fabricating the semiconductor device in accordance with one embodiment of the present disclosure.

Figure 12:
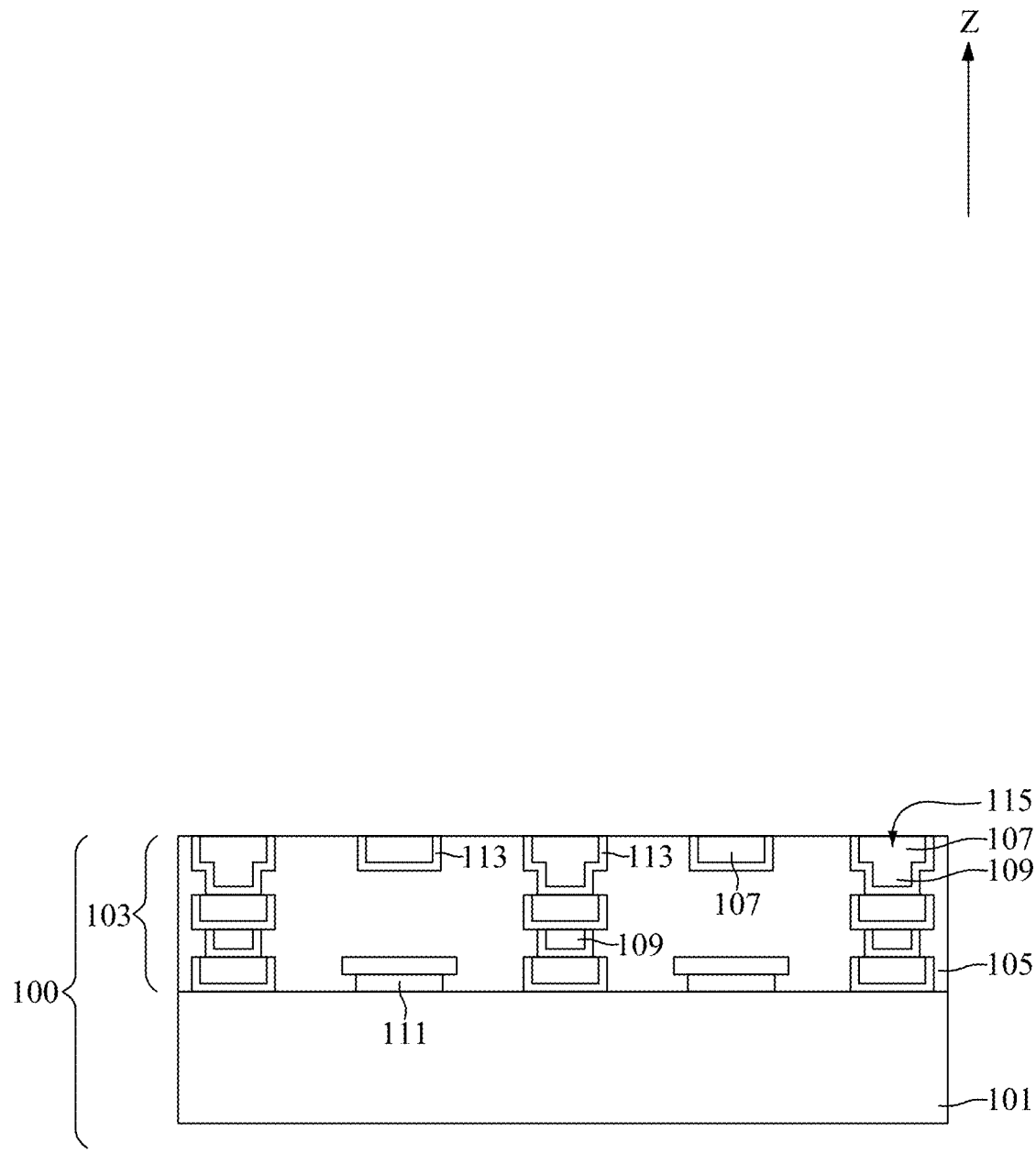
FIGS. 12 to 16 illustrate, in schematic cross-sectional view diagrams, a flow for fabricating the semiconductor device in accordance with one embodiment of the present disclosure.

With reference to FIGS. 11 and 12, at step S11, a first semiconductor structure 100 may be provided. The first semiconductor structure 100 may include a first substrate 101 and a first interconnection structure 103 formed on the first substrate 101. The first interconnection structure 103 may include a first insulating layer 105, a plurality of device elements, a plurality of first conductive features, a plurality of first barrier layers 113, and a plurality of first guard rings 115. The plurality of device elements of the first semiconductor structure 100 may be formed in a lower portion of the first insulating layer 105. Portions of some of the plurality of device elements may be formed in an upper portion of the first substrate 101. The plurality of first conductive features, the plurality of first barrier layers 113, and the plurality of first guard rings 115 may be formed in the first insulating layer 105. The plurality of first conductive features may include, for example, a plurality of first conductive lines 107, a plurality of first conductive vias 109, and a plurality of first conductive contacts 111. Some of the plurality of first conductive lines 107, some of the plurality of first conductive vias 109, and some of the plurality of first barrier layers 113 may together form the plurality of first guard rings 115. The plurality of device elements of the first semiconductor structure 100 and the plurality of first conductive features may be electrically connected.

Figure 13:
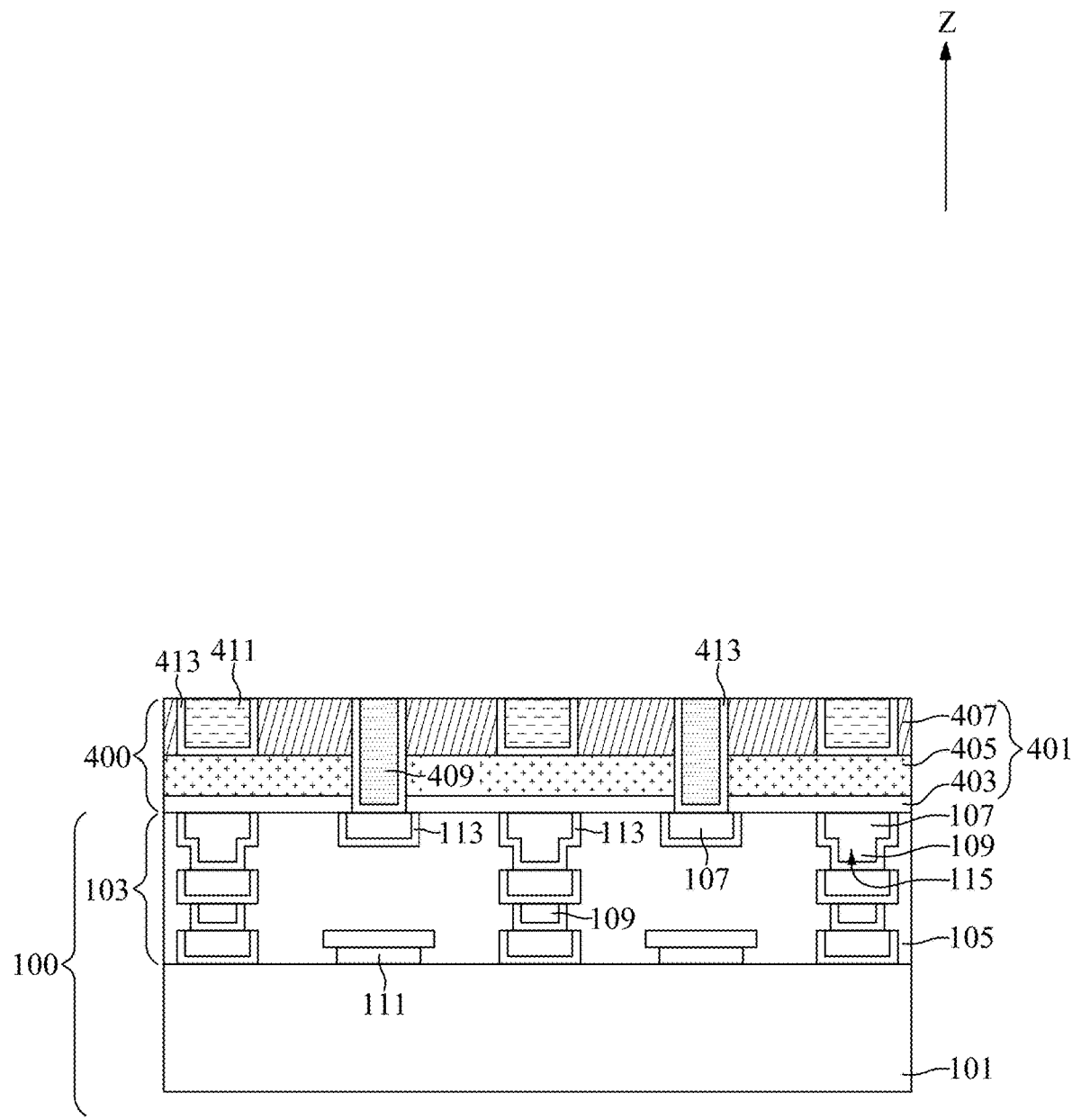

With reference to FIGS. 11 and 13, at step S13, a first connecting structure 400 may be formed on the first semiconductor structure 100. The first connecting structure 400 may include a first connecting insulating layer 401, a plurality of first connecting contacts 409, a plurality of first supporting contacts 411, and a plurality of first liners 413. The first connecting insulating layer 401 may include a first bottom insulating layer 403, a first middle insulating layer 405, and a first top insulating layer 407. The first bottom insulating layer 403, the first middle insulating layer 405, and the first top insulating layer 407 may be sequentially formed on the first interconnection structure 103.

A series of photolithography processes, etching processes, deposition processes, and planarization processes may be performed to form the plurality of first connecting contacts 409, the plurality of first supporting contacts 411, and the plurality of first liners 413. The plurality of first connecting contacts 409 may be formed so as to penetrate the first top insulating layer 407, the first middle insulating layer 405, and the first bottom insulating layer 403 and may be electrically connected to some of the plurality of first conductive features adjacent to a top surface of the first interconnection structure 103. The plurality of first supporting contacts 411 may be formed in the first top insulating layer 407. The plurality of first liners 413 may be formed between the plurality of first connecting contacts 409 and the first connecting insulating layer 401, between the plurality of first supporting contacts 411 and the first connecting insulating layer 401, and between the plurality of first connecting contacts 409 and the some of the plurality of first conductive features adjacent to a top surface of the first interconnection structure 103.

Figure 14:
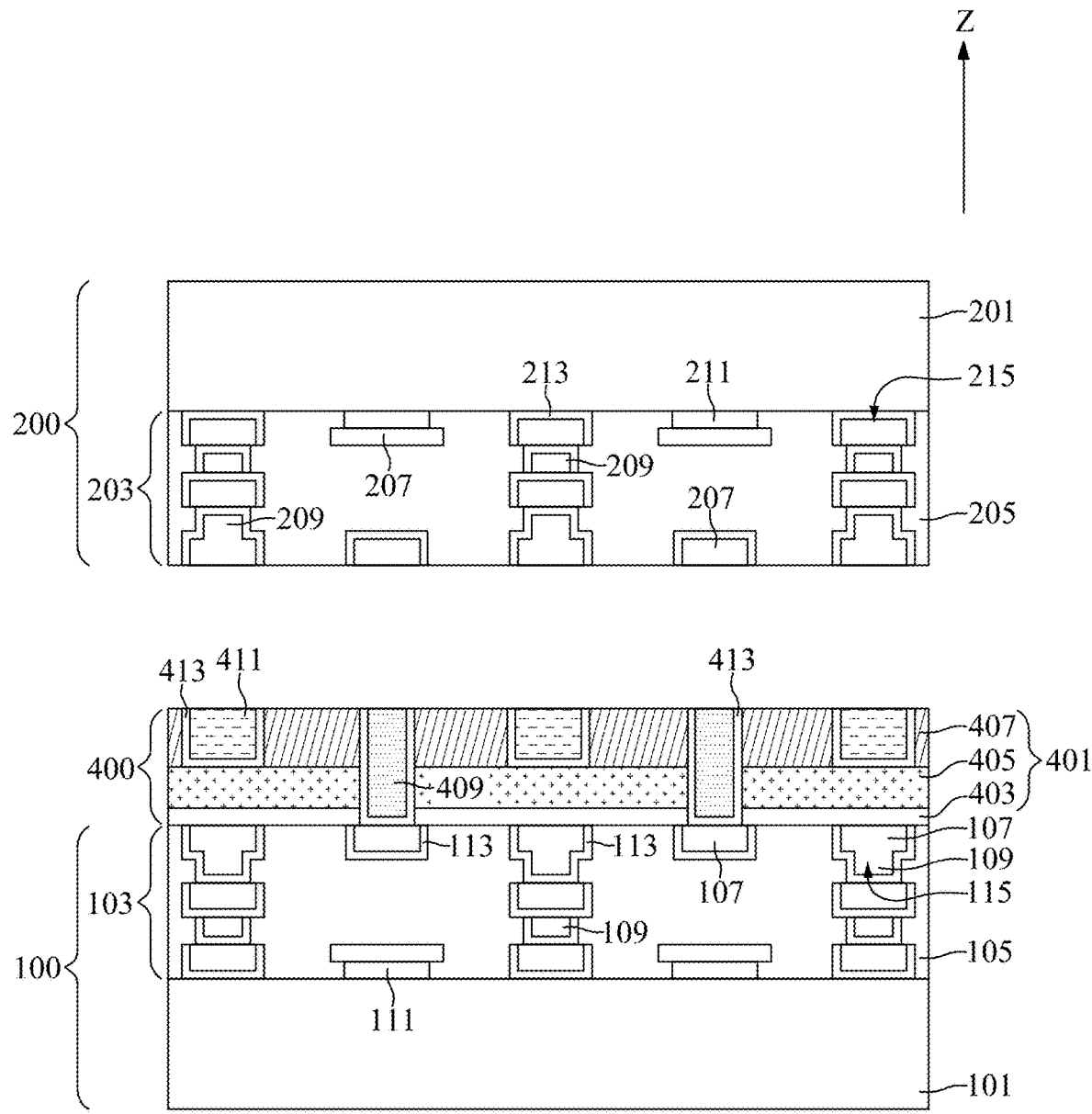
Figure 15:
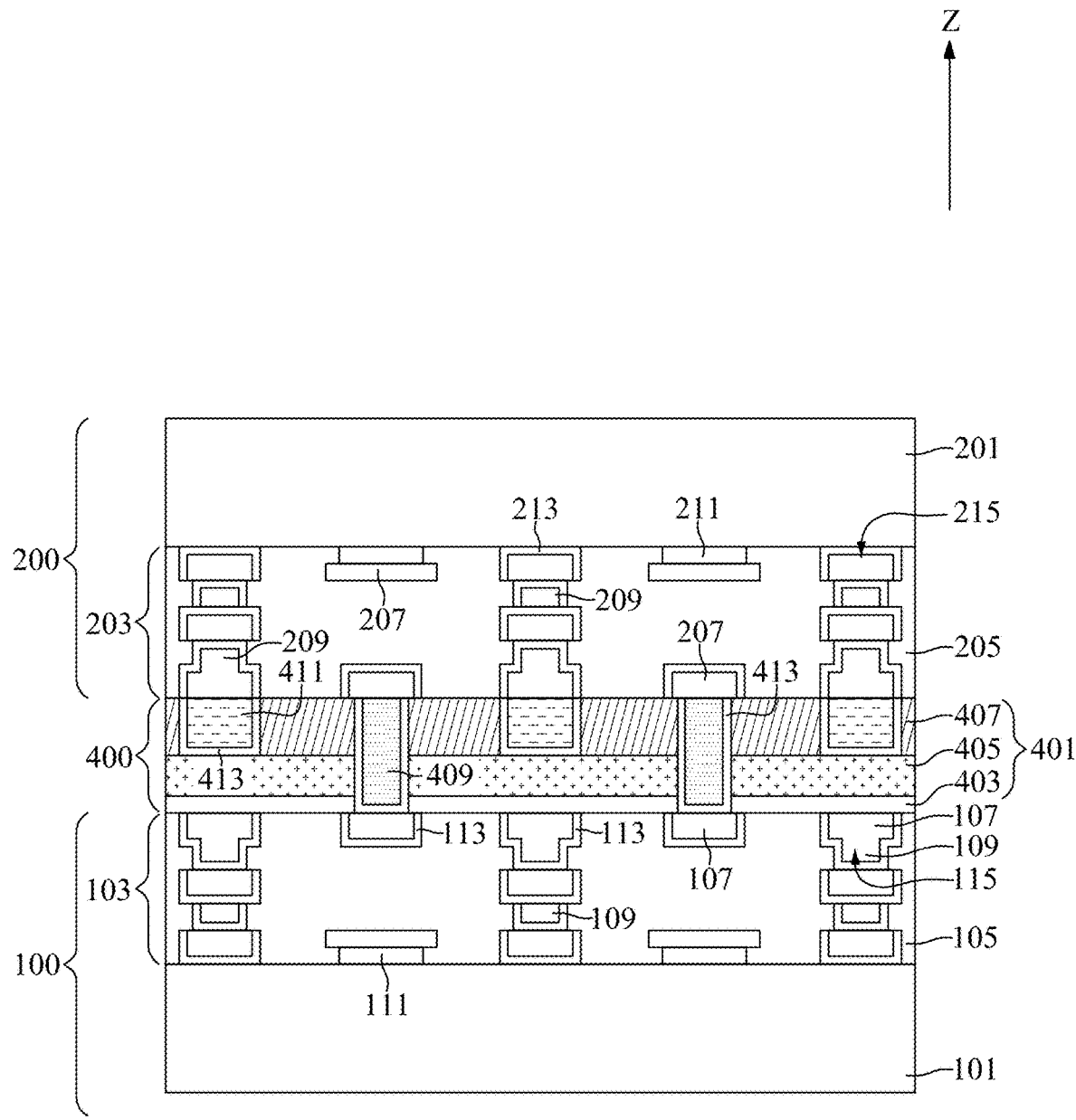

With reference to FIGS. 11, 14, and 15, at step S15, a second semiconductor structure 200 may be bonded to the first connecting structure 400 through a bonding process. With reference to FIG. 14, a second semiconductor structure 200 may be provided. The second semiconductor structure 200 may be formed by a procedure similar to that used to form the first semiconductor structure 100, and may have a structure similar to that of the first semiconductor structure 100. The second semiconductor structure 200 may be placed in an upside-down manner. With reference to FIG. 15, the upside-down second semiconductor structure 200 may be placed on the top surface of the first connecting structure 400. A thermal treatment may be performed to achieve a hybrid bonding between elements of the second semiconductor structure 200 and the first connecting structure 400 for the bonding process. The hybrid bonding may include an oxide-to-oxide bonding and a metal-to-metal bonding. The oxide-to-oxide bonding may originate from the bonding between the second insulating layer 205 and the first top insulating layer 407. The metal-to-metal bonding may originate from the bonding between the plurality of first connecting contacts 409 and some of the plurality of second conductive lines 207, and from the bonding between the plurality of first supporting contacts 411 and the plurality of second guard rings 215. A temperature of the bonding process may be between about 300° C. and about 450° C. A thinning process may be performed on the second substrate 201 using an etching process, a chemical polishing process, or a grinding process to reduce a thickness of the second substrate 201.

Figure 16:
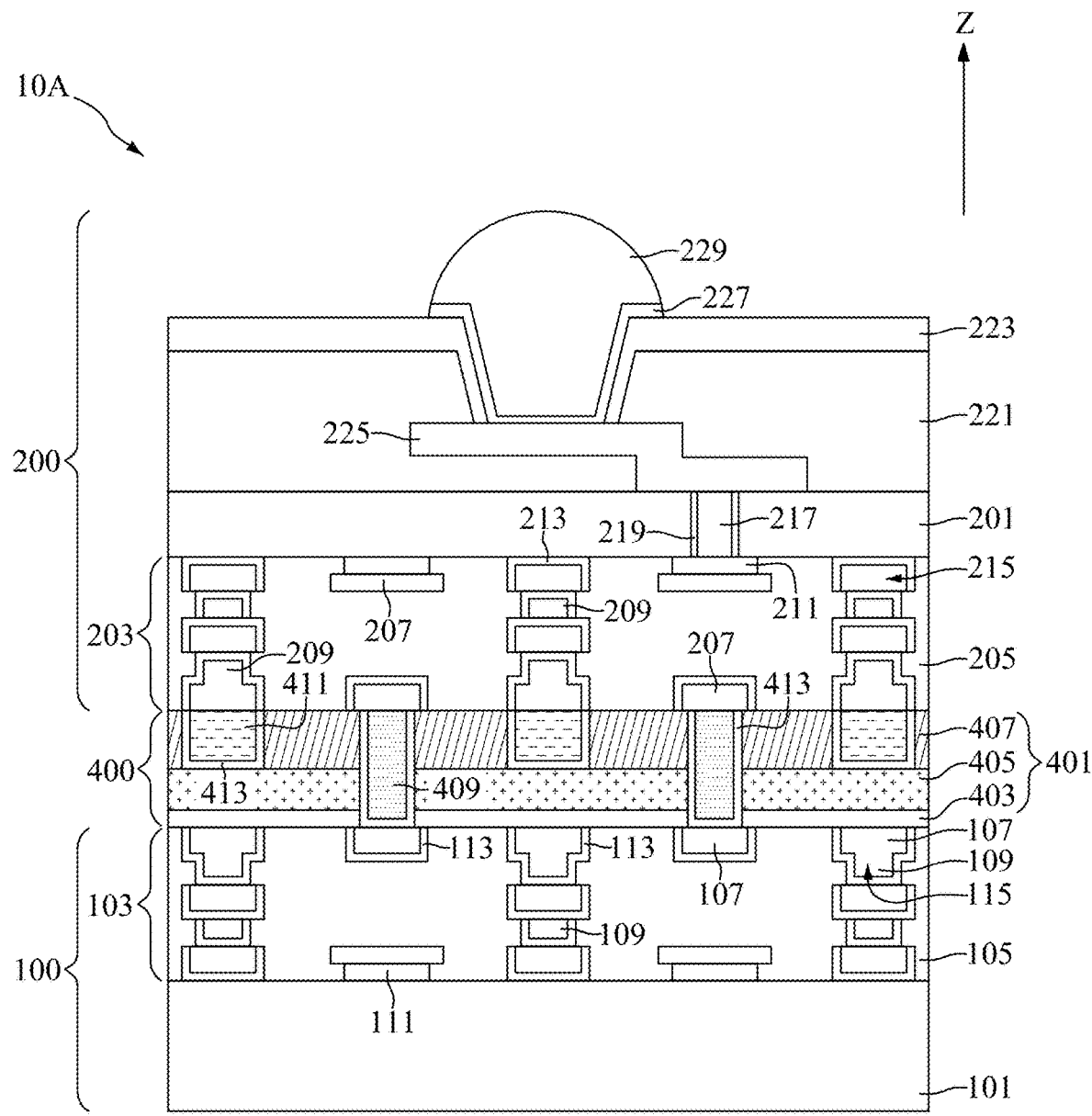

With reference to FIGS. 11 and 16, at step S17, a second through substrate via 217 and second insulating sidewalls 219 may be formed in the second substrate 201 of the second semiconductor structure 200 and a second bottom passivation layer 221, a second top passivation layer 223, a second redistribution layer 225, a second under bump metallization layer 227, and a second conductive bump 229 may be formed on the second substrate 201 of the second semiconductor structure 200. The second bottom passivation layer 221 and the second top passivation layer 223 may be sequentially formed on the second substrate 201. The second redistribution layer 225 may be formed in the second bottom passivation layer 221. The second through substrate via 217 may be formed in the second substrate 201 and may electrically connect the second redistribution layer 225 to one of the plurality of second conductive contacts 211. A portion of the second bottom passivation layer 221 and a portion of the second top passivation layer 223 may be recessed to form an opening to expose a portion of a top surface of the second redistribution layer 225. The second under bump metallization layer 227 and the second conductive bump 229 may be sequentially formed in the opening.

FIGS. 17 to 20 illustrate, in schematic cross-sectional view diagrams, a flow for fabricating a semiconductor device 10B in accordance with another one embodiment of the present disclosure.

Figure 17:
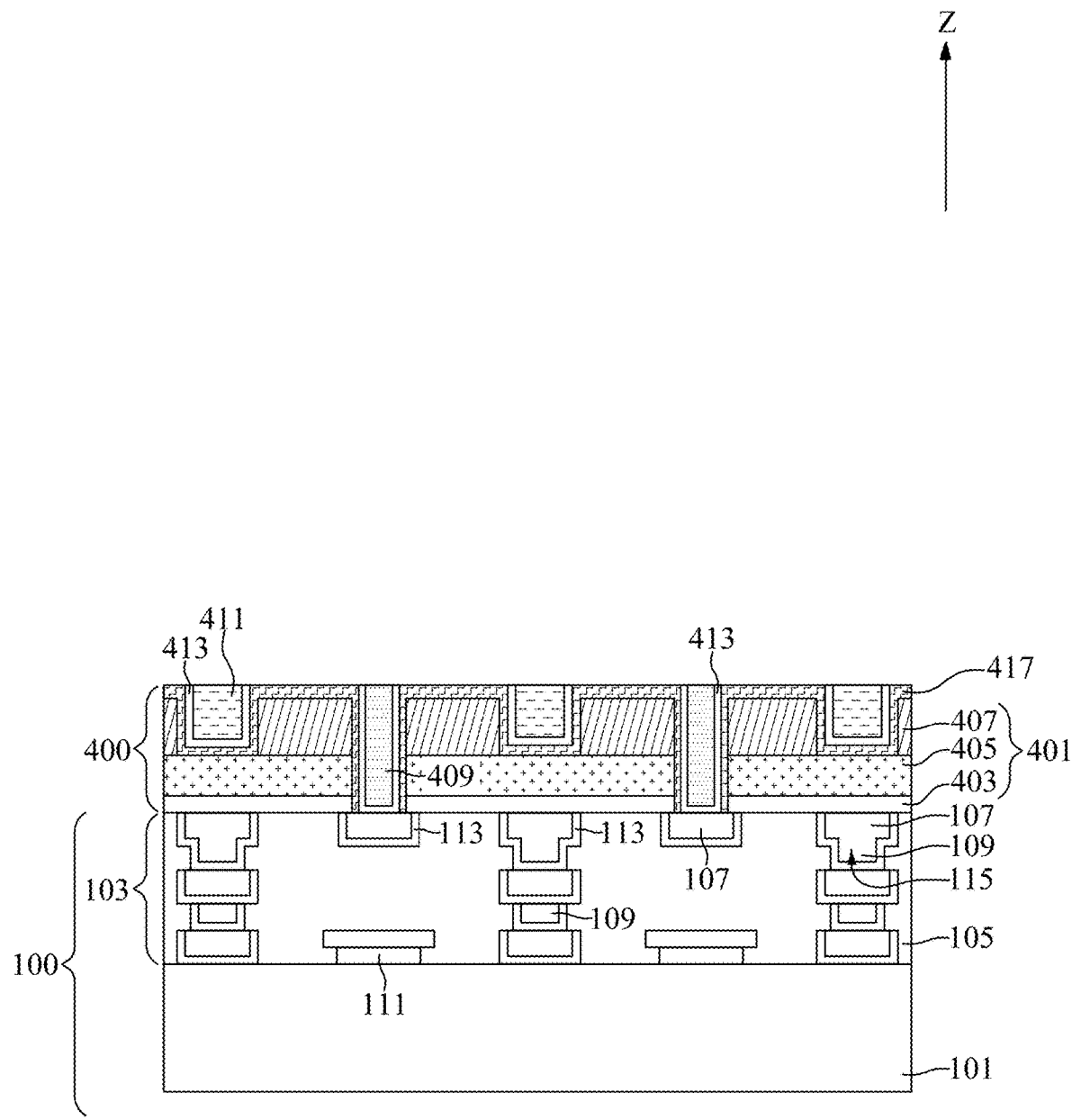
FIGS. 17 to 20 illustrate, in schematic cross-sectional view diagrams, a flow for fabricating a semiconductor device in accordance with another embodiment of the present disclosure.

With reference to FIG. 17, a layer of an energy-removable material 417 may be formed on the top surface of the first top insulating layer 407, formed between the plurality of first connecting contacts 409 and the first connecting insulating layer 401, and formed between the plurality of first supporting contacts 411 and the first connecting insulating layer 401. The energy-removable material 417 may include a material such as a thermal decomposable material, a photonic decomposable material, an e-beam decomposable material, or a combination thereof. For example, the energy-removable material 417 may include a base material and a decomposable porogen material that is sacrificially removed upon exposure to an energy source. The base material may include a methylsilsesquioxane based material. The decomposable porogen material may include a porogen organic compound that provides porosity to the base material of the energy-removable material. After formation of the layer of the energy-removable material 417, an energy treatment may be performed on the intermediate semiconductor device in FIG. 17 by applying the energy source thereto. The energy source may include heat, light, or a combination thereof. When heat is used as the energy source, a temperature of the energy treatment may be between about 800° C. and about 900° C. When light is used as the energy source, an ultraviolet light may be applied. The energy treatment may remove the decomposable porogen material from the energy-removable material to generate empty spaces (pores), with the base material remaining in place.

Alternatively, in another embodiment, the base material may be silicon oxide. The decomposable porogen material may include compounds including unsaturated bonds such as double bonds or triple bonds. During the energy treatment, the unsaturated bonds of the decomposable porogen material may cross-link with silicon oxide of the base material. As a result, the decomposable porogen material may shrink and generate empty spaces, with the base material remaining in place. The empty spaces may be filled with air so that a dielectric constant of the empty spaces may be significantly low. In some embodiments, the base material may be low-k dielectric materials.

In some embodiments, the energy-removable material 417 may include a relatively high concentration of the decomposable porogen material and a relatively low concentration of the base material, but is not limited thereto. For example, the energy-removable material 417 may include about 75% or greater of the decomposable porogen material, and about 25% or less of the base material. In another example, the energy-removable material 417 may include about 95% or greater of the decomposable porogen material, and about 5% or less of the base material. In another example, the energy-removable material 417 may include about 100% of the decomposable porogen material, and no base material. In another example, the energy-removable material 417 may include about 45% or greater of the decomposable porogen material, and about 55% or less of the base material.

Figure 18:
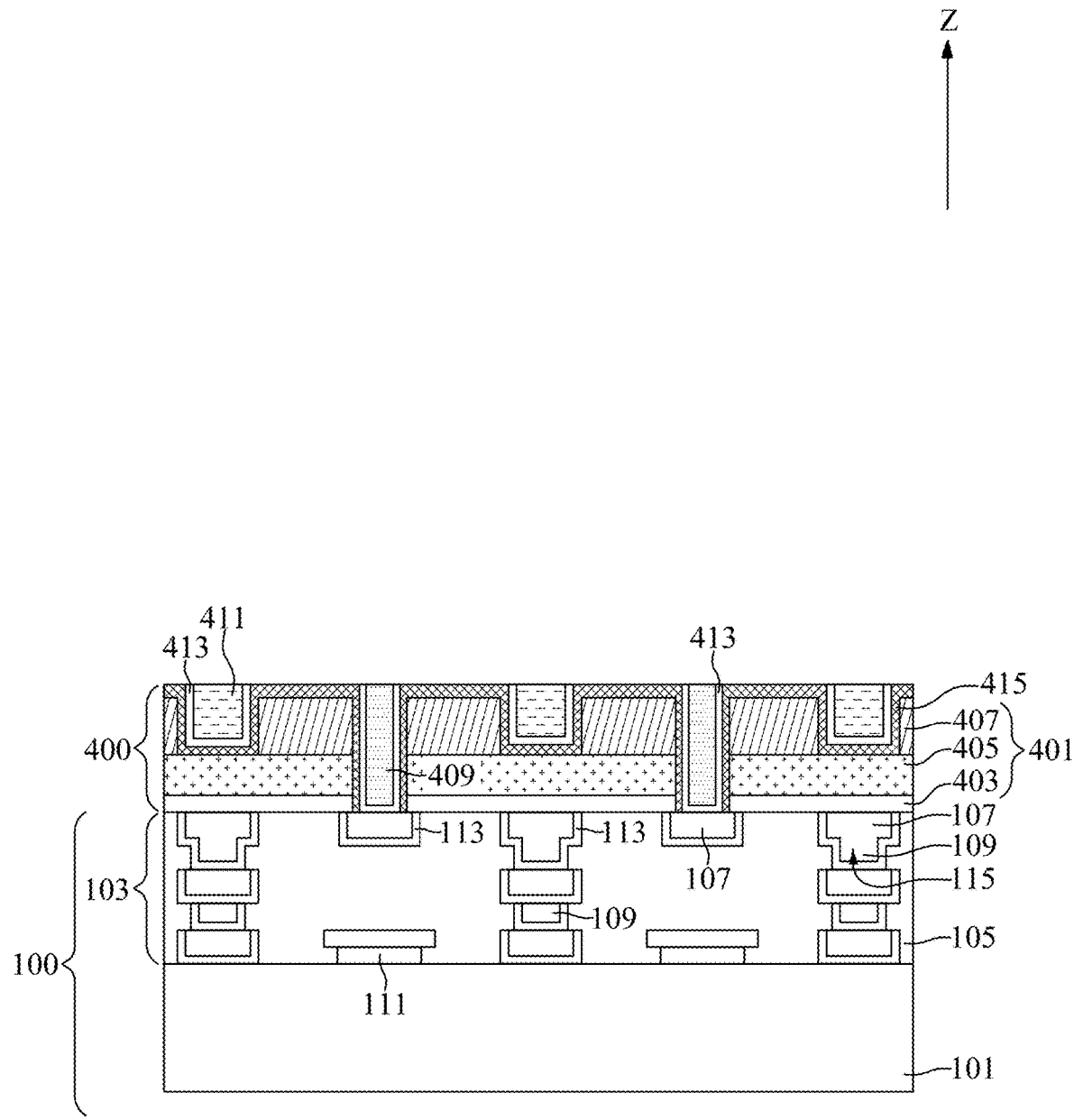

With reference to FIG. 18, after the energy treatment, the layer of the energy-removable material 417 may turn into a first porous layer 415. The base material may turn into a skeleton of the first porous layer 415 and the empty spaces may be distributed throughout the skeleton of the first porous layer 415. According to the composition of the energy-removable material 417, the first porous layer 415 may have a porosity of 45%, 75%, 95%, or 100%. A planarization process, such as chemical mechanical polishing, may be performed after the energy treatment to provide a substantially flat surface for subsequent processing steps.

Figure 19:
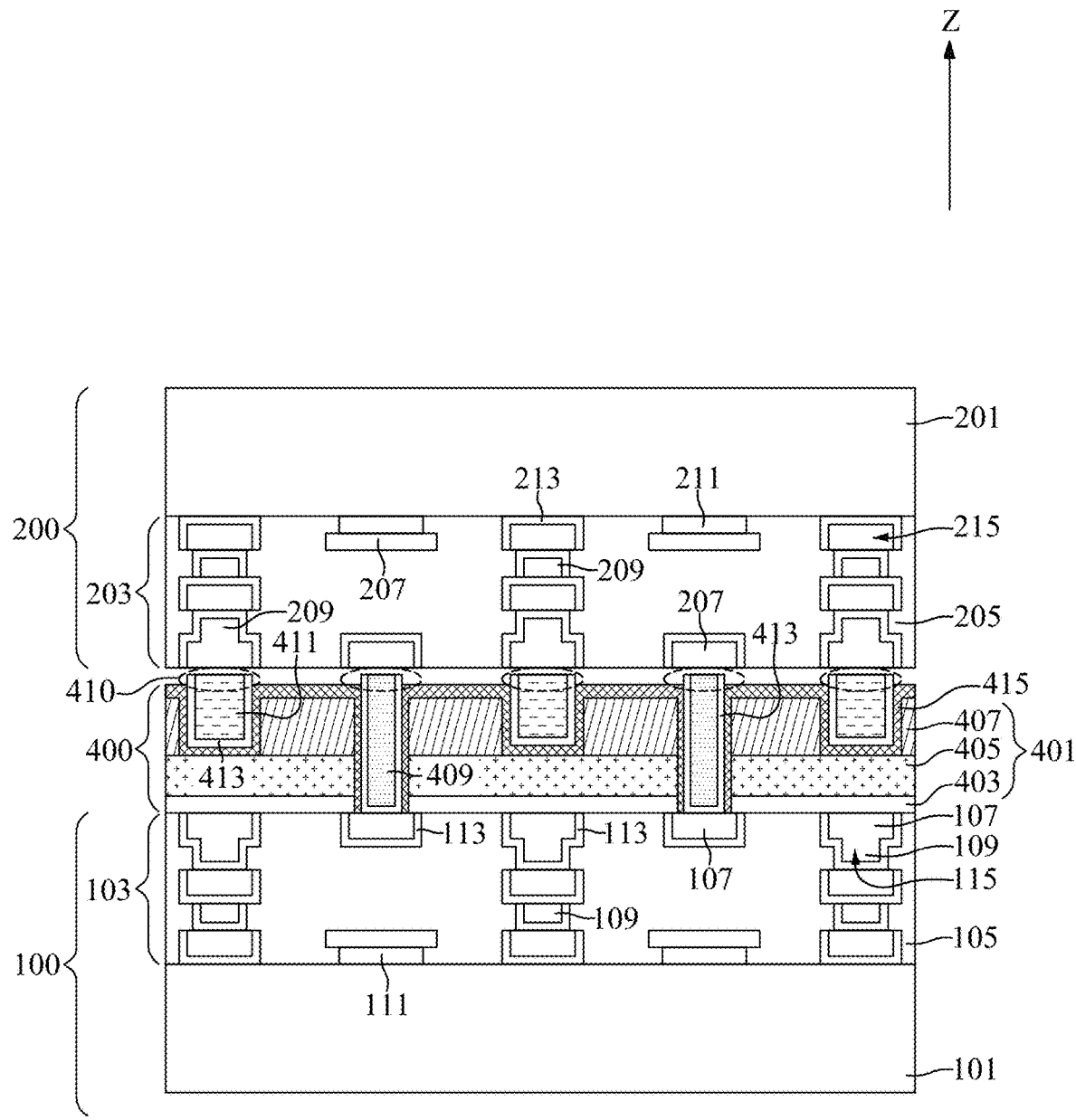
Figure 20:
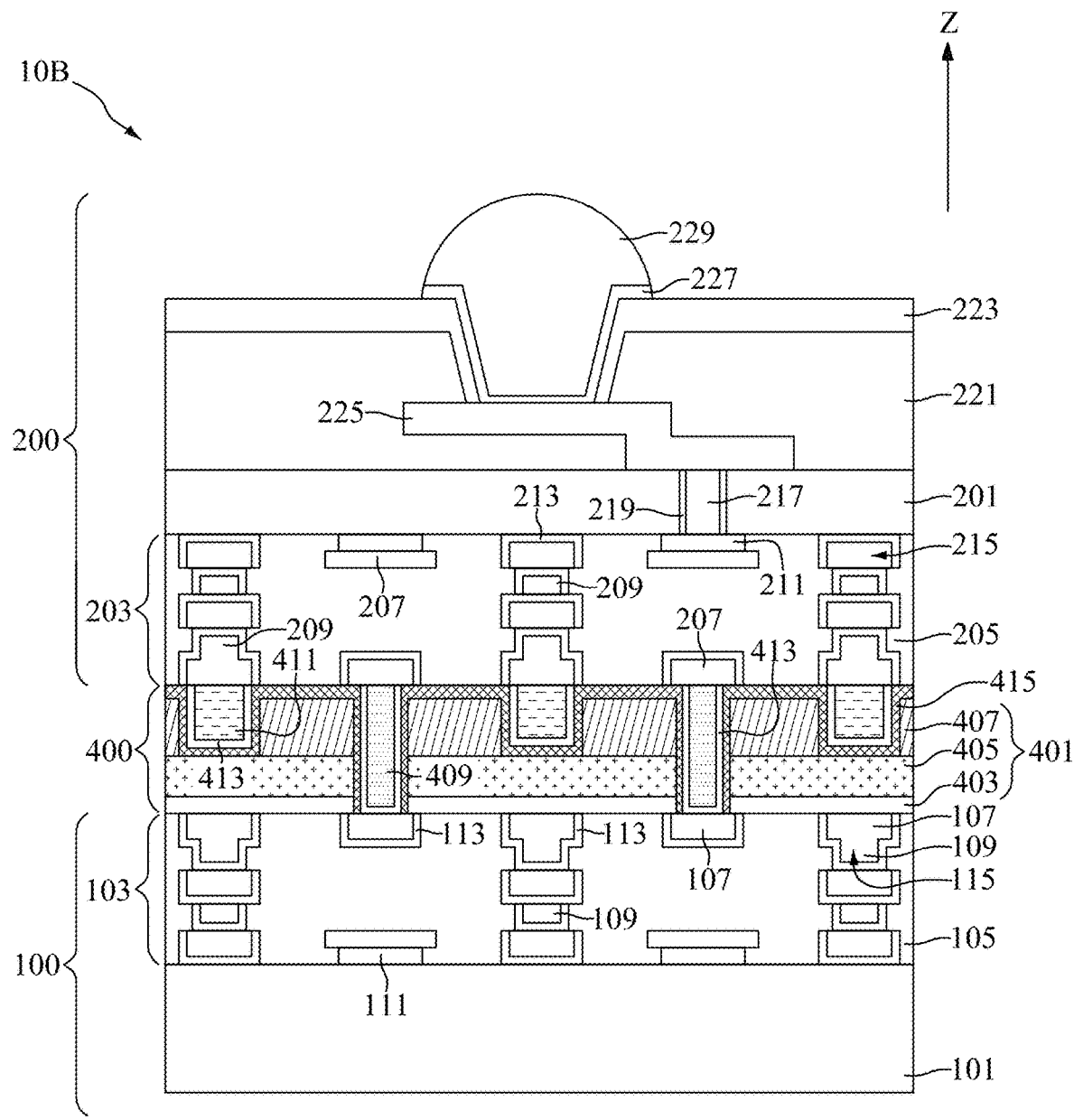

With reference to FIG. 19, during a bonding process between the first connecting structure 400 and the second semiconductor structure 200, the first porous layer 415 formed on the top surface of the first top insulating layer 407 may be thinned due to its porous characteristic. As a result, the top surfaces of the plurality of first connecting contacts 409, the top surfaces of the plurality of first supporting contacts 411, and the top surfaces of the plurality of first liners 413 may form a plurality of protrusions 410. The plurality of protrusions may prevent the metal-to-metal bonding from dielectrically interfering with the first top insulating layer 407 or the second insulating layer 205. Therefore, a more reliable bonding between the second semiconductor structure 200 and the first connecting structure 400 may be achieved. With reference to FIG. 20, elements may be formed with a procedure similar to that illustrated in FIG. 16.

Figure 21:
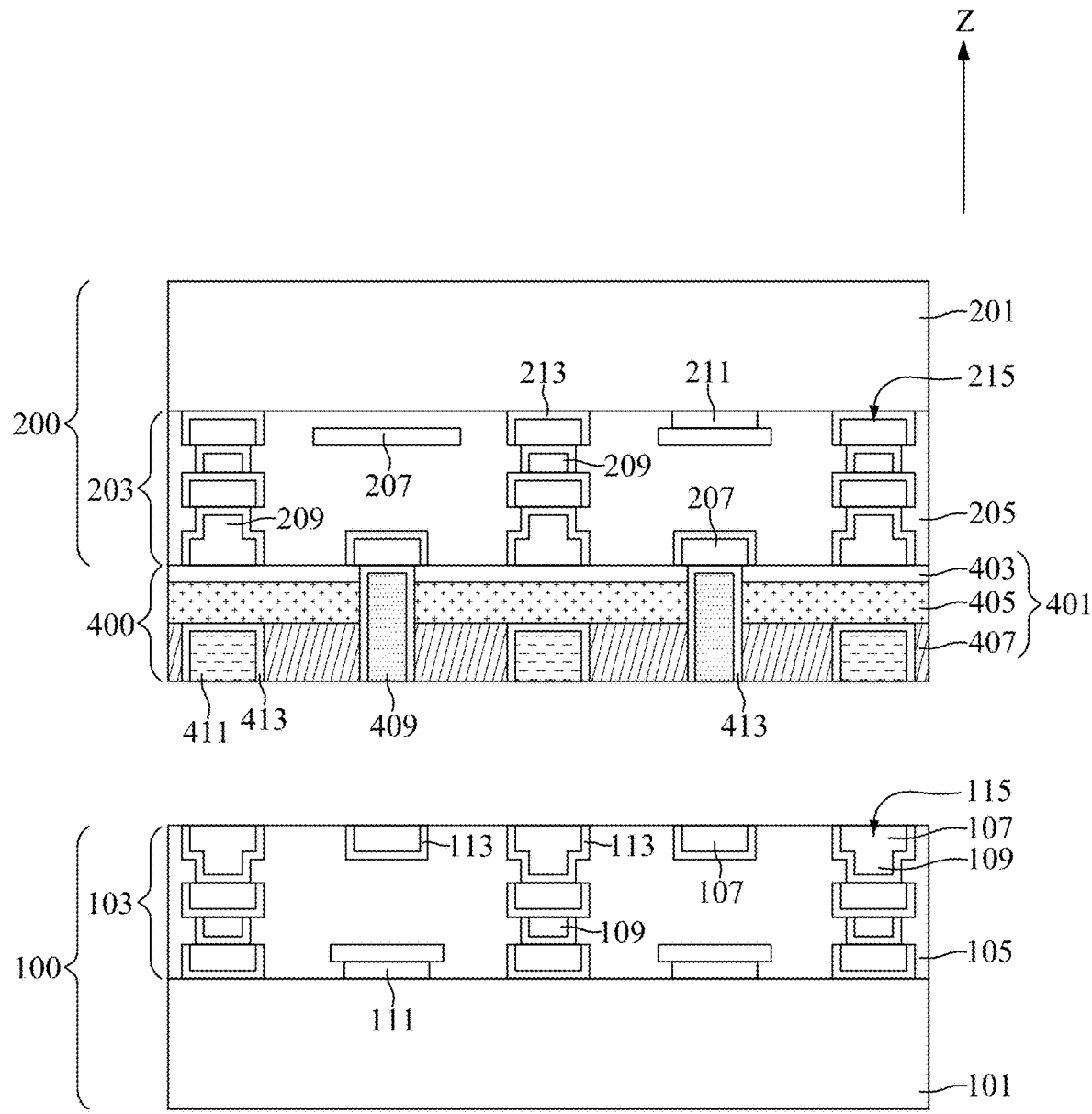
FIGS. 21 to 23 illustrate, in schematic cross-sectional view diagrams, a flow for fabricating a semiconductor device in accordance with another embodiment of the present disclosure.
Figure 22:
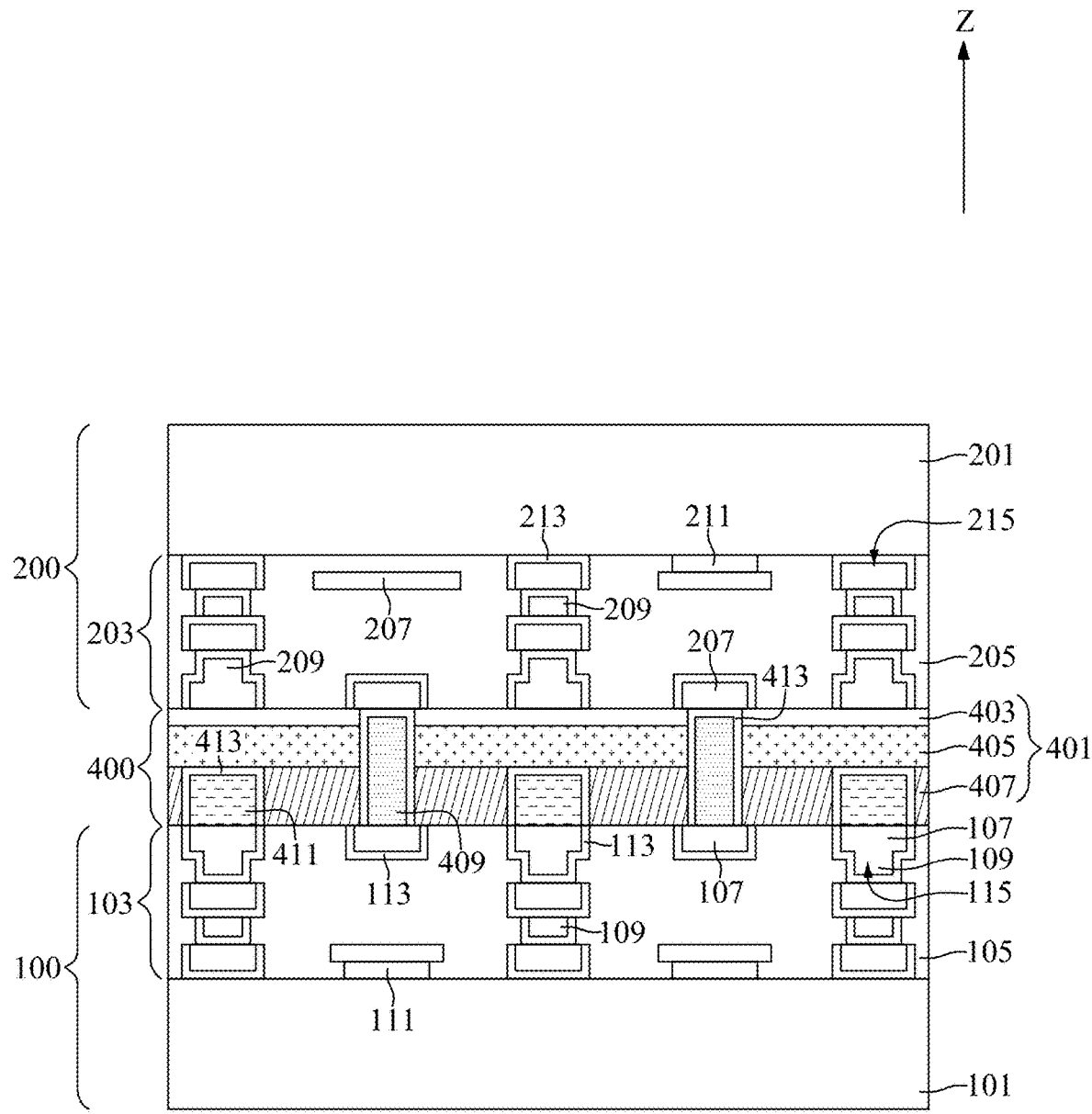
Figure 23:
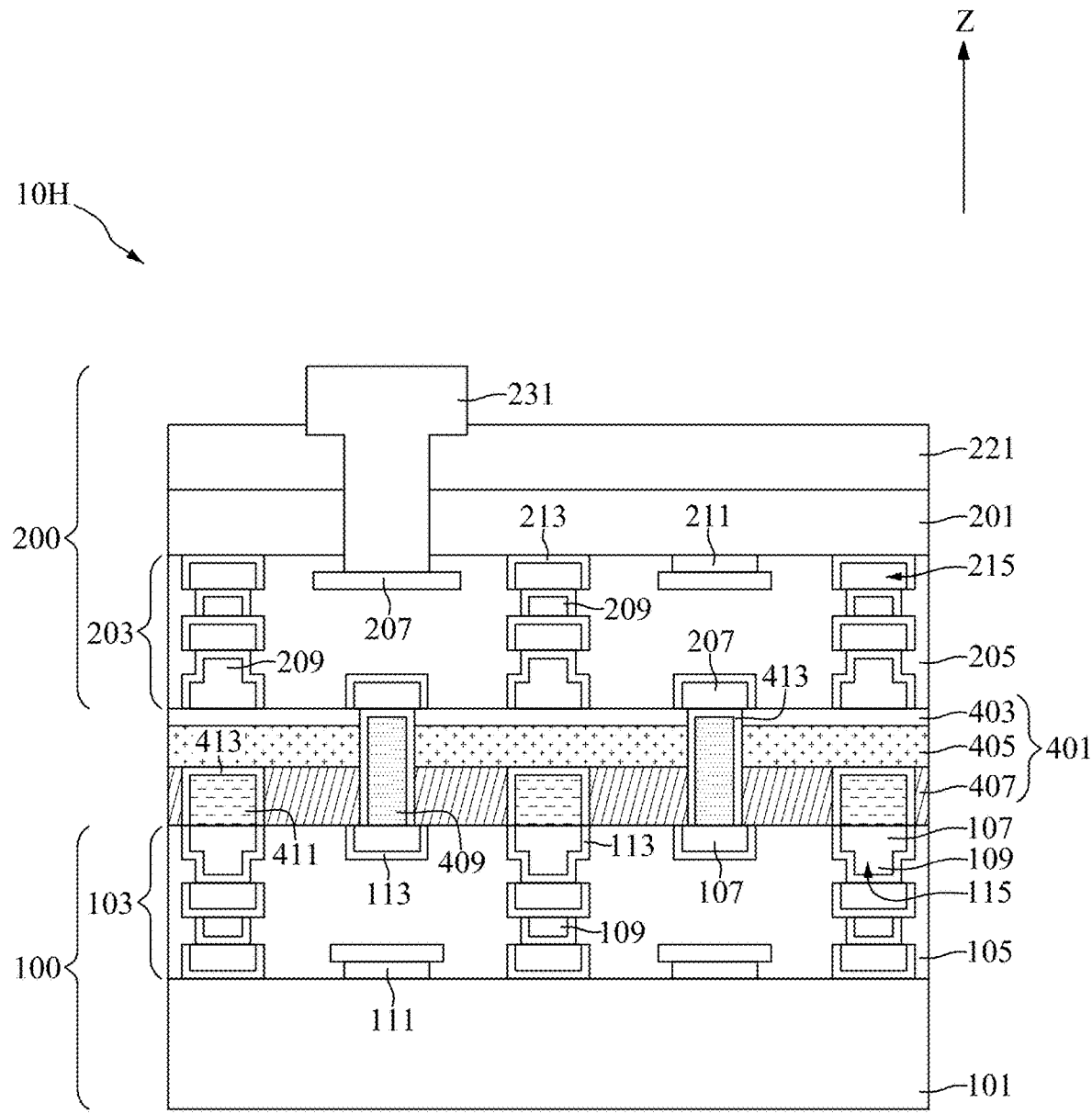

FIGS. 21 to 23 illustrate, in schematic cross-sectional view diagrams, a flow for fabricating a semiconductor device 10H in accordance with another embodiment of the present disclosure.

With reference to FIG. 21, a first semiconductor structure 100 and a second semiconductor structure 200 may be formed in a procedure similar to that illustrated in FIG. 12. The first connecting structure 400 may be formed on the second semiconductor structure 200 with a procedure similar to that illustrated in FIG. 13. Subsequently, the second semiconductor structure 200 and the first connecting structure 400 may be placed in an upside-down manner and above the first semiconductor structure 100.

With reference to FIG. 22, a bonding process may be performed to bond the first connecting structure 400 to the first semiconductor structure 100. A thermal treatment may be applied to the intermediate semiconductor device in FIG. 22 to achieve the hybrid bonding of the first semiconductor structure 100 to the first connecting structure 400. With reference to FIG. 23, a second bottom passivation layer 221 may be formed on the second substrate 201. A second pad structure 231 may be formed so as to penetrate the second bottom passivation layer 221, the second substrate 201, and an upper portion of the second insulating layer 205. The second pad structure 231 may be electrically connected to one of the plurality of second conductive lines 207.

One aspect of the present disclosure provides a semiconductor device, comprising: a first semiconductor structure; a first connecting structure comprising a first connecting insulating layer positioned on the first semiconductor structure, a plurality of first connecting contacts positioned in the first connecting insulating layer, and a plurality of first supporting contacts positioned in the first connecting insulating layer; and a second semiconductor structure positioned on the first connecting structure, wherein the top surfaces of the plurality of first connecting contacts contact a bottom surface of the second semiconductor structure; wherein a top surface of the plurality of first connecting contact and a top surface of the plurality of first supporting contact protrude from a top surface of the first connecting insulating layer.

Another aspect of the present disclosure provides a method for fabricating a semiconductor device, comprising: providing a first semiconductor structure; forming a first connecting structure comprising a first connecting insulating layer on the first semiconductor structure, a plurality of first connecting contacts in the first connecting insulating layer, and a plurality of first supporting contacts in the first connecting insulating layer, wherein a top surface of the plurality of first connecting contact and a top surface of the plurality of first supporting contact protrude from a top surface of the first connecting insulating layer; and bonding a second semiconductor structure to the first connecting structure, wherein the top surfaces of the plurality of first connecting contacts contact a bottom surface of the second semiconductor structure;

Due to the design of the semiconductor device of the present disclosure, multiple semiconductor devices may be connected together through the first connecting structure to provide more sophisticated functionality while occupying less volume. Therefore, the cost of the semiconductor device may be reduced, and the profit of the semiconductor device may be increased. In addition, the plurality of first supporting contacts may improve the bonding strength between the first connecting structure and the multiple semiconductor structures.

In addition, the plurality of protrusions may prevent the metal-to-metal bonding from dielectrically interfering with the first top insulating layer or the second insulating layer. Therefore, a more reliable bonding between the second semiconductor structure and the first connecting structure may be achieved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor device, comprising:
   a first semiconductor structure;
   a first connecting structure comprising a first connecting insulating layer positioned on the first semiconductor structure, a plurality of first connecting contacts positioned in the first connecting insulating layer, and a plurality of first supporting contacts positioned in the first connecting insulating layer; and
   a second semiconductor structure positioned on the first connecting structure, wherein the top surfaces of the plurality of first connecting contacts contact a bottom surface of the second semiconductor structure;
   wherein a top surface of the plurality of first connecting contact and a top surface of the plurality of first supporting contact protrude from a top surface of the first connecting insulating layer;
   wherein the plurality of first connecting contacts have a thickness greater than a thickness of the plurality of first supporting contacts.

2. The semiconductor device of claim 1, wherein the first semiconductor structure comprises a first substrate positioned below the first connecting structure and a first interconnection structure positioned between the first substrate and the first connecting structure, wherein the first connecting insulating layer is positioned on the first interconnection structure.

3. The semiconductor device of claim 2, wherein the first interconnection structure comprises a first insulating layer positioned on the first substrate and a plurality of first conductive features positioned in the first insulating layer, wherein the bottom surfaces of the first connecting contacts contact top surfaces of the plurality of first conductive features coplanar with a top surface of the first insulating layer.

4. The semiconductor device of claim 3, wherein the second semiconductor structure comprises a second interconnection structure positioned on the first connecting structure and a second substrate positioned on the second interconnection structure, wherein the second interconnection structure comprises a second insulating layer positioned on the first connecting structure and a plurality of second conductive features positioned in the second insulating layer, wherein the top surfaces of the plurality of first connecting contacts contact bottom surfaces of the plurality of second conductive features coplanar with a bottom surface of the second insulating layer.

5. The semiconductor device of claim 4, wherein the second interconnection structure comprises a plurality of guard rings positioned in the second insulating layer, wherein bottom surfaces of the plurality of guard rings contact the top surfaces of the plurality of first supporting contacts.

6. The semiconductor device of claim 5, further comprising a plurality of first liners positioned on sidewalls of the plurality of first connecting contacts and the bottom surfaces of the plurality of first connecting contacts.

7. The semiconductor device of claim 6, further comprising a first porous layer positioned between the first connecting insulating layer and the second insulating layer, between the first connecting insulating layer and the plurality of first connecting contacts, and between the first connecting insulating layer and the plurality of first supporting contacts, wherein a porosity of the first porous layer is between about 25% and about 100%.

8. The semiconductor device of claim 7, further comprising a plurality of first liners positioned between the first porous layer and the plurality of first connecting contacts and between the first porous layer and the first supporting contacts.

9. The semiconductor device of claim 8, further comprising a through substrate via positioned in the second substrate.

10. The semiconductor device of claim 1, wherein the first connecting insulating layer comprises a first bottom insulating layer positioned on the top surface of the first semiconductor structure, a first middle insulating layer positioned on the first bottom insulating layer, and a first top insulating layer positioned on the first middle insulating layer, wherein the plurality of first connecting contacts penetrate the first bottom insulating layer, the first middle insulating layer, and the first top insulating layer, and the plurality of first supporting contacts are positioned in the first top insulating layer.

11. The semiconductor device of claim 1, further comprising a second connecting structure positioned on the first connecting structure, and a second semiconductor structure positioned on the second connecting structure, wherein the second connecting structure comprises a second connecting insulating layer positioned on the first connecting structure, a plurality of second connecting contacts positioned in the second connecting insulating layer, and a plurality of second supporting contacts positioned in the second connecting insulating layer, wherein bottom surfaces of the plurality of second connecting contacts contact the top surfaces of the plurality of first connecting contacts.

12. The semiconductor device of claim 1, wherein the cross-sectional profile of sidewalls of the plurality of first connecting contacts is slanted.

13. A method for fabricating a semiconductor device, comprising:
   providing a first semiconductor structure;
   forming a first connecting structure comprising a first connecting insulating layer on the first semiconductor structure, a plurality of first connecting contacts in the first connecting insulating layer, and a plurality of first supporting contacts in the first connecting insulating layer, wherein a top surface of the plurality of first connecting contact and a top surface of the plurality of first supporting contact protrude from a top surface of the first connecting insulating layer; and bonding a second semiconductor structure to the first connecting structure, wherein the top surfaces of the plurality of first connecting contacts contact a bottom surface of the second semiconductor structure;
   wherein the first connecting insulating layer comprises a first bottom insulating layer formed on the first semiconductor structure, a first middle insulating layer formed on the first bottom insulating layer, and a first top insulating layer formed on the first middle insulating layer, wherein the plurality of first connecting contacts are formed so as to penetrate the first top insulating layer, the first middle insulating layer, and the first bottom insulating layer and the plurality of first supporting contacts are formed in the first top insulating layer.

14. The method for fabricating the semiconductor device of claim 13, further comprising:
   forming a layer of an energy-removable material on a top surface of the first connecting insulating layer, between the plurality of first connecting contacts and the first connecting insulating layer, and between the plurality of first supporting contacts and the first connecting insulating layer; and
   performing an energy treatment to turn the layer of energy-removable material into a first porous layer,
   wherein a porosity of the first porous layer is between about 25% and about 100%.

15. The method for fabricating the semiconductor device of claim 14, wherein the energy-removable material comprises a base material and a decomposable porogen material.

16. The method for fabricating the semiconductor device of claim 15, wherein the base material comprises methylsilsesquioxane, low-dielectric materials, or silicon oxide.

17. The method for fabricating the semiconductor device of claim 16, wherein an energy source of the energy treatment is heat, light, or a combination thereof.

18. The method for fabricating the semiconductor device of claim 17, further comprising: thinning the first porous layer on the top surface of the first top insulating layer such that the top surface of the plurality of first connecting contact and the top surface of the plurality of first supporting contact protrude from the top surface of the first connecting insulating layer.

* * * * *